(12) United States Patent
Kusakabe et al.

(10) Patent No.: US 6,207,886 B1
(45) Date of Patent: Mar. 27, 2001

(54) SKUTTERUDITE THERMOELECTRIC MATERIAL THERMOELECTRIC COUPLE AND METHOD OF PRODUCING THE SAME

(75) Inventors: Hiroki Kusakabe, Sakai; Masuo Takigawa, Nara, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/343,680

(22) Filed: Jun. 30, 1999

(30) Foreign Application Priority Data

Jun. 30, 1998 (JP) ................................. 10-201194
Dec. 28, 1998 (JP) ................................. 10-372730

(51) Int. Cl.$^7$ .................................................. H01L 35/34
(52) U.S. Cl. .......................... 136/201; 136/205; 136/240
(58) Field of Search ............................... 136/236.1, 240, 136/201, 203, 205

(56) References Cited

U.S. PATENT DOCUMENTS

| | | | |
|---|---|---|---|
| 5,610,366 | 3/1997 | Fleurial et al. | 136/202 |
| 5,747,728 | 5/1998 | Fleurial et al. | 136/203 |
| 5,769,943 | 6/1998 | Fleurial et al. | 117/219 |
| 5,929,351 | * 7/1999 | Kusakabe et al. | 75/228 |
| 5,994,639 | * 11/1999 | Johnson et al. | 136/236.1 |

FOREIGN PATENT DOCUMENTS

| | | |
|---|---|---|
| 8-186294 | 7/1996 | (JP) . |
| 9-64422 | 3/1997 | (JP) . |
| 9-260729 | 10/1997 | (JP) . |

OTHER PUBLICATIONS

Chapon et al., Nickel–substituted skutterudites: synthesis, structural and electrical properties, Journal of Alloys and Compounds 282 pp. 58–63, Received Jul. 24, 1998.*

Scales et al. Filled Skutterudites Antimonides: A new Class of Thermoelctric Materials, Science, vol. 272, pp. 1325–1328, May 1996.*

* cited by examiner

Primary Examiner—Kathryn Gorgos
Assistant Examiner—Thomas H Parsons
(74) Attorney, Agent, or Firm—Wenderoth, Lind & Ponack, L.L.P.

(57) ABSTRACT

The present invention relates to a skutterudite thermoelectric material for directly converting heat generated by the Seebeck effect into electricity, and provides a method of producing a Co—Sb-based filled-skutterudite sintered material having a lower thermal conductivity and thereby having a higher figure of merit. The crystal grains of a Sb-containing skutterudite compound and a metal oxide dispersed in the crystal grain boundaries are sintered to obtain the skutterudite thermoelectric sintered material. The metal oxide prevents growth of grains in the process of sintering, whereby the skutterudite compound is finely pulverized to have an average crystal grain size of 20 $\mu$m or less. As a result, the areas at the boundaries of the fine crystal grains are increased, phonon scattering is enhanced, the thermal conductivity is decreased, and the figure of merit is increased. The metal oxide is an oxide of a rare earth metal. The skutterudite compound includes a filled-skutterudite compound having a composition of $Ln_yFe_xCo_{4-x}Sb_{12}$ (Ln: a rare earth metal, $0<x\leq 4$, $0<y\leq 1$).

16 Claims, 13 Drawing Sheets

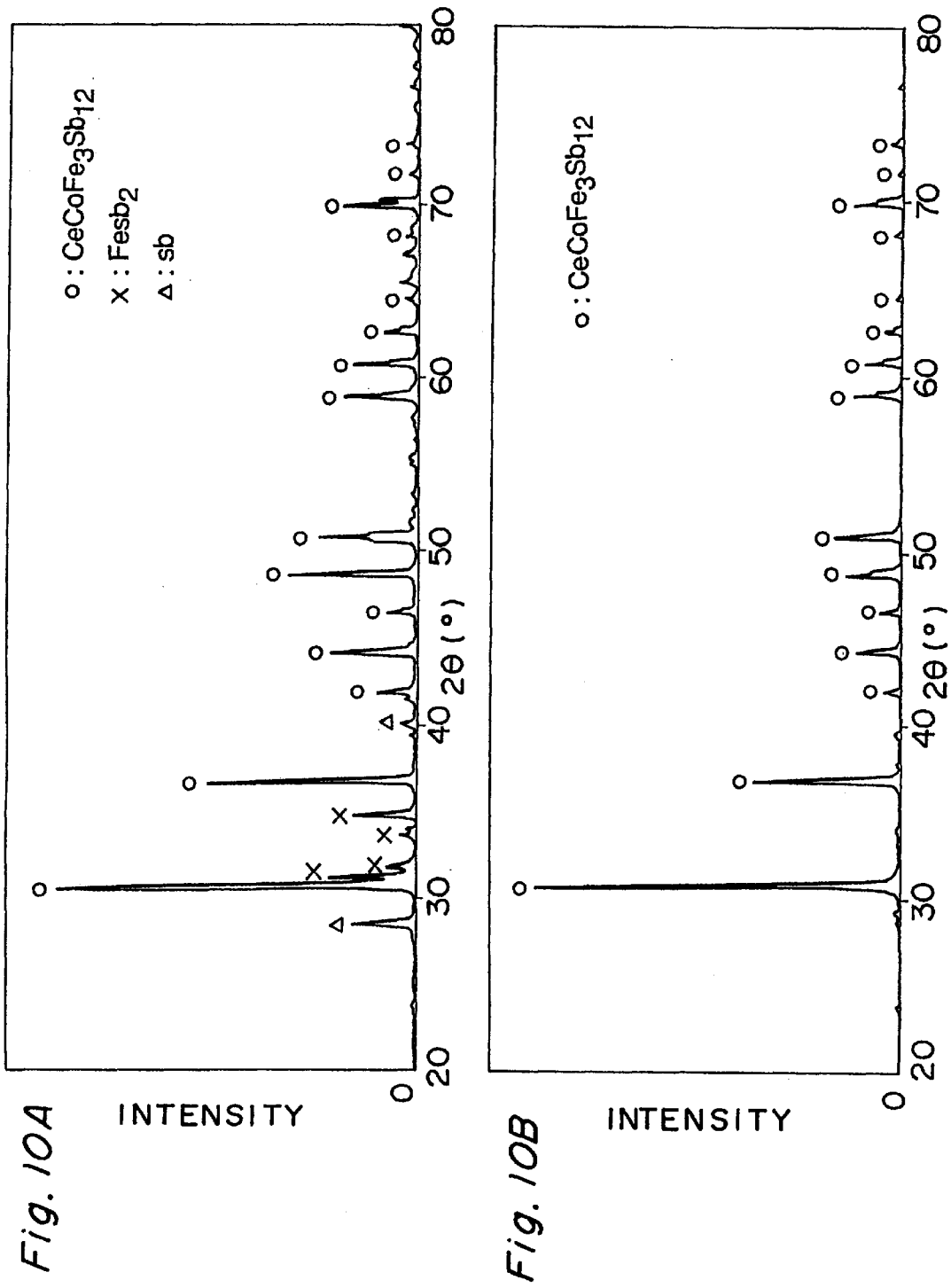

SKUTTERUDITE THERMOELECTRIC MATERIAL THERMOELECTRIC COUPLE AND METHOD OF PRODUCING THE SAME

BACKGROUND OF THE INVENTION

1. Field of the Invention

The present invention relates to a skutterudite thermoelectric material for directly converting heat to electricity caused by the Seebeck effect, to a thermoelectric couple using the thermoelectric material, and to a method of producing the thermoelectric material and the thermoelectric couple.

2. Description of the Related Art

Conventionally, $Bi_2Te_3$-based thermoelectric materials have been well known as thermoelectric materials based on the Seebeck effect, and have been used practically in some applications. However, the materials have a very narrow range of operating temperatures, and are limited to be used at around room temperature.

Furthermore, it is also known that such a thermoelectric material is formed of a $CoSb_3$-based intermetallic compound having a skutterudite crystal structure. This $CoSb_3$-based compound features high electron and hole mobility, and is expected to become a material wherein high thermoelectric conversion characteristics are compatible with a wide operating temperature range.

An important characteristic required for thermoelectric materials is represented by a figure of merit $Z = S^2\sigma/\kappa$, wherein S is a Seebeck coefficient, $\sigma$ is an electric conductivity, and $\kappa$ is a thermal conductivity. Both higher Seebeck coefficient S and electric conductivity $\sigma$ in the thermoelectric material, and lower thermal conductivity $\kappa$ are desired to increase the figure of merit Z. These parameters are determined depending on the kinds and amounts of impurities added to the main ingredients of the thermoelectric material. In addition, the parameters are also changeable due to dispersing impurity particles in the crystal grain boundaries as a second phase As a prior art, Japanese Patent Publication JP-A 9-260729 discloses an electric conductivity $\sigma$ of the sintered material being improved at the presence of a metal Sb phase as a second phase in the grain boundaries of a sintered material including $CoSb_3$ as the main ingredient.

Furthermore, the above-mentioned Japanese Patent Publication JP-A 9-260729 also discloses a method of producing a thermoelectric sintered body. In this method, powder of a $CoSb_3$-based alloy including a metal Sb phase is formed under pressure, and heated at a higher temperature than the liquidus temperature of Sb, then, obtaining a sintered material in which the Sb phase dispersed in the grain boundaries.

Recently, compounds having filled-skutterudite structures represented by the formula of $LnT_4Pn_{12}$ (Ln: a rare earth metal, T: a transition metal, and Pn: an element, such as P, As, Sb or the like) have received attention as thermoelectric materials.

Filled-skutterudite is a crystal wherein part of a pair of vacancies existing at the octant of the unit cell of the skutterudite crystal is filled with a heavy element, such as a rare earth metal. When the vacancies in the skutterudite crystal are filled with the atoms of a rare earth metal, such as Ce, the atoms of Ce oscillate because of a weak bond to Sb and act as the centers of phonon scattering. As a result, it can be expected that the thermal conductivity can be decreased significantly.

As a prior art regarding this, for example, D. T. Morelli and G. P. Meisner; "High figure of merit in Ce-filled-skutterudite," I.E.E.E., 15th International Conference on Thermoelectronics (1996), pp91, have studied the characteristics of $CeFe_xCo_{4-x}Sb_{12}$-based skutterudite thermoelectric materials filled with Ce and part of Co of which is substituted with Fe. According to this study, as the number x of substitutions of Fe with respect to Co increases in the range of 2 to 4, the electric conductivity increases, the thermal conductivity decreases, and the Seebeck coefficient decreases. To obtain the highest figure of merit, the number x of substitutions is required to have a suitable range.

In order to use these materials for a thermoelectric module, it is advantageous to form a p-n junction by using two kinds of Co—Sb-based filled-skutterudite thermoelectric materials. In this case, the filled-skutterudite structure filled with a rare earth metal can be used as a p-type thermoelectric material.

Regarding a thermoelectric module formed from thermoelectric materials, Japanese Patent Publication JP-A 9-64422 discloses that a Co—Pt—Sb-based compound is used as an n-type and a PbTe-based compound is used as an n-type, and that the two compound materials are joined to each other directly or indirectly via a metal conductor to form a p-n junction. In this method, the powders of the two compounds are press-formed integrally into a horseshoe-shaped compact so that they are joined to each other at their leading ends. The compact is then sintered to produce a thermoelectric couple.

In the case of a conventional material wherein a Sb phase is dispersed as a second phase to $CoSb_3$, although the electric conductivity $\sigma$ increases, the Seebeck coefficient S decreases, whereby a power factor $S^2\sigma$ is not improved significantly. In addition, the dispersion of the Sb phase does not decrease the thermal conductivity $\kappa$. Therefore, the thermal conductivity must be decreased in order to further improve the characteristics of the $CoSb_3$-based thermoelectric material. In addition, depending on the grain size of the Sb phase to be mixed, dispersion becomes non-uniform, thereby causing segregation and unstable characteristics because of the segregation.

Although the filled-skutterudite structure is expected to have excellent thermoelectric characteristics, it is unstable thermally and is apt to be decomposed. In order that one vacant octant is filled with the heavy atoms of a rare earth element, the charges in a cell must be balanced. For example, in the case when a tetravalent atom of lanthanide is used for filling, charges can be compensated for by substituting four divalent Co atoms in the skutterudite structure with, for example, four trivalent Fe atoms. Since the skutterudite structure cannot be obtained by using only the Fe and Sb, part of the filled-skutterudite structure may be decomposed into $FeSb_2$ and Sb, when the number of valencies of an element filled in the crystal lattices is not constant. In addition, in order to act as the centers of phonons, the filling element is required to have a weak bond to Sb in the lattices. For these reasons, the bond between the Ln and Sb atoms is thermally unstable. At high temperatures, the filling element falls from the lattice of the filling element, causing a problem of generating decomposition of skutterudite.

Furthermore, in order to assemble these materials so as to be used as a thermoelectric module, it is necessary to form a p-n junction by using two kinds of thermoelectric materials. Conventionally, regarding an n-type, it is reported that a material capable of having a high Seebeck coefficient S and a high electric conductivity $\sigma$ is obtained by adding Pd or Pt to the $CoSb_3$ crystals (see Japanese Patent Publication JP-A 8-186294). However, to obtain a p-type thermoelectric material, it is considered that a metal element, such as an iron-group transition metal, i.e., Mn, Cr, Fe, Ru or the like, is added to the $CoSb_3$ crystals. However, since the addition of such a metal abruptly decreases the Seebeck coefficient S, the power factor is not improved. For this reason, the characteristics of such a conventional thermoelectric material are unsatisfactory as a p-type material.

Moreover, the filled-skutterudite thermoelectric material having a filled-skutterudite structure filled with rare earth metals is a p-type. Regarding an n-type, a method of controlling the carrier level by adding Co has been attempted. However, satisfactory results have not yet been obtained.

Additionally, in the case when materials used at high temperatures, such as the skutterudite thermoelectric materials, is formed into a module, a brazing method or the like has been used to obtain a p-n junction at the high-temperature end of the module. In this case, however, problems of improper contacts or wiring breakage are caused at increased usage temperatures due to the difference between the thermal expansion coefficient of a metal used for connection and that of the thermoelectric material.

SUMMARY OF THE INVENTION

An object of the present invention is to provide a Sb-containing skutterudite material capable of further improving the figure of merit of a Co—Sb-based skutterudite thermoelectric material, and a method of producing the sintered material. Therefore, the present invention is intended to further decrease the thermal conductivity of the skutterudite sintered material, while improving its thermal stability.

Another object of the present invention is to provide a filled-skutterudite sintered material capable of further improving the figure of merit of the thermoelectric material, and to provide a method of producing such a sintered thermoelectric material.

Furthermore, a still another object of the present invention is to provide a highly reliable thermoelectric module formed of skutterudite thermoelectric materials, and to provide a method of producing the module. Therefore, the present invention is intended to provide a highly reliable p-n junction.

In accordance with the present invention, as a Sb-containing skutterudite thermoelectric material, a sintered material is formed of refined crystal grains of skutterudite. For this reason, the area of the crystal grain boundary with respect to the crystal grain size of the sintered material is increased, the scattering of phonons in the crystal grain boundaries is accelerated, and the thermal conductivity required as a thermoelectric material is decreased.

The thermoelectric material of the present invention is a sintered material wherein the particles of a metal oxide are dispersed in the crystal grain boundaries of the skutterudite crystal phase. The particles of the metal oxide prevents grain growth in the process of sintering, whereby the crystal phase is formed of fine grains, and the thermal conductivity of the thermoelectric material is decreased.

In other words, the metal oxide phase is in the crystal grain boundaries of a $CoSb_3$-based compound, and prevents grain growth of the $CoSb_3$ crystals in the process of sintering so that the sintered material has a densified sinter structure. Therefore, the area of crystal grain boundary with respect to the crystal grain size of the sintered material is increased, the scattering of phonons in the crystal grain boundaries is accelerated, and the thermal conductivity is decreased.

Numerous oxide particles themselves existing in the crystal grain boundaries also cause phonon scattering, and decrease the thermal conductivity. As a result, the metal oxide phase improves the figure of merit of the skutterudite thermoelectric material.

In particular, a rare earth metal oxide is used as a metal oxide. When precipitated in the crystal grain boundaries, a small amount of the rare earth metal improves the Seebeck coefficient S. Particles of a rare earth metal or the like having a high atomic weight also increase the scattering coefficients of electrons and holes, thereby increasing the Seebeck coefficient S.

In accordance with the present invention, the $CoSb_3$-based compound mainly composed of Co and Sb should preferably include a transition metal. Part of Co is substituted with the transition metal, thereby changing and improving the Seebeck coefficient S. A transition metal, such as Cr, Mn, Fe or Ru, is used as a p-type dopant. A Ni-group metal (Ni, Pd or Pt) or a precious metal (Cu, Ag or Au) is used as an n-type dopant.

A Sb-containing skutterudite compound includes a $Ln_yFe_xCo_{4-x}Sb_{12}$-based filled-skutterudite. In the present invention, the filled-skutterudite crystals are prevented from being decomposed, thereby preventing the thermoelectric characteristics from being lowered because of decomposition. In the thermoelectric material, precipitation phases, such as $FeSb_2$ and Sb, are reduced to decrease the thermal conductivity. This kind of decomposition occurs as described below. In the processes up to sintering, the filling element Ln in the filled-skutterudite crystals is oxidized by the oxygen inside the thermoelectric material and eliminated from the crystal lattices. As a result, part of the unstable filled-skutterudite structure is decomposed into $FeSb_2$ and Sb. Therefore, the processes in the range of material preparation to sintering in the present invention are carried out in a nonoxidative atmosphere.

In the filled-skutterudite thermoelectric material of the present invention, an element, such as Ni, Pd or Pt, is selected as a dopant, and a $Ln_yFe_xM_{4-x}Sb_{12}$-based compound is used. In the case when Co is added, a stable $CoSb_3$ phase is generated, and the filling of Ln into the lattices becomes insufficient. However, neither Ni nor Pd forms stable compounds with Sb, whereby the element acts as a complete dopant. Therefore, no second phase is generated, and the carrier level can be controlled. As a result, it is possible to obtain an n-type filled-skutterudite thermoelectric material.

The thermoelectric couple of the present invention is formed by a direct junction of two kinds of thermoelectric materials, i.e., p-type and n-type thermoelectric materials having skutterudite crystals including Sb. The two materials are homogeneous and have a very small difference in their thermal expansion coefficients, thereby providing a stable thermoelectric couple free from fracture or separation at the junction portion of both the materials.

A plurality of the couples are connected to one another and arranged in series, with their low-temperature side portions connected by using metal conductors, so as to be used as a thermoelectric module.

BRIEF DESCRIPTION OF THE DRAWINGS

The present invention will be described below in detail referring to the accompanying drawings, in which:

FIG. 10A is an X-ray diffraction chart for the powder of a $CeCoFe_3Sb_{12}$ compound before mechanical ironing, and FIG. 10B is an X-ray diffraction chart for the powder of the compound after mechanical ironing;

EMBODIMENTS OF THE INVENTION

Figure 1A:
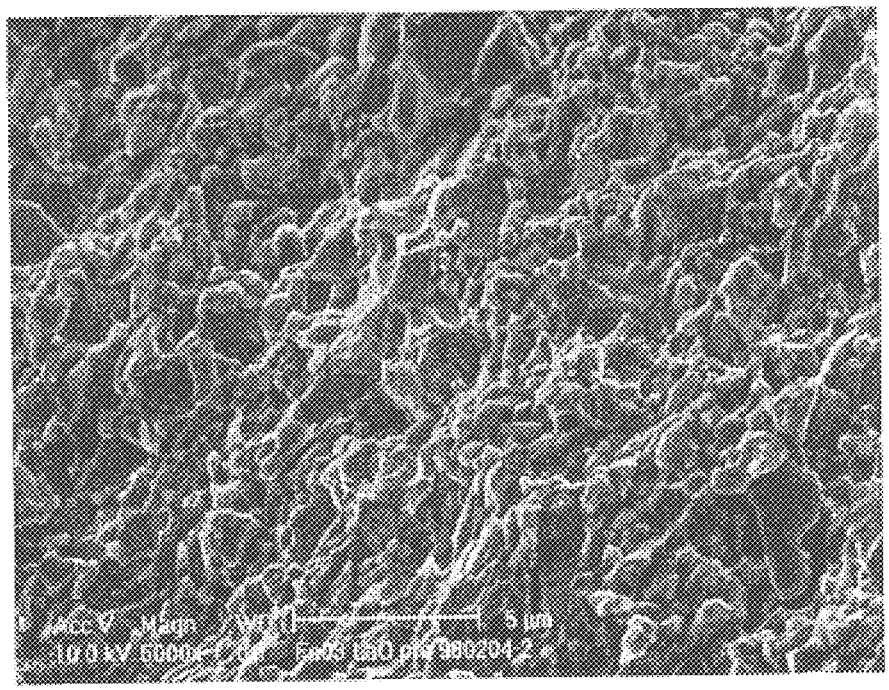
FIG. 1A is an SEM photograph showing the distribution of particles at a cutaway surface of the sintered material formed of a mixture of a $Co_{0.997}Fe_{0.003}Sb_3$ compound and $La_2O_3$ in accordance with an example of the present invention.

The skutterudite including Sb in accordance with the present invention includes filled-skutterudite compounds, such as $InSb_3$-based, $CoSb_3$-based and $Ln_yFe_xCo_{4-x}Sb_{12}$-based skutterudite compounds, wherein Sb is included as a main ingredient. $Ln_yFe_xM_{4-x}Sb_{12}$-based compounds are also used, wherein Co is substituted with one of the elements of Ni, Pd and Pt.

The thermoelectric material of the present invention is a sintered material formed of the above-mentioned compounds. The average crystal grain size of the sintered material is limited to 100 μm or less. If the average crystal grain size exceeds 100 μm, its thermal conductivity increases undesirably.

In particular, a crystal grain size of 20 μm or less is effective in decreasing the thermal conductivity. Accordingly, the crystal grain size is adjusted in the range of 5 to 10 μm in particular. This crystal grain size of the sintered material can be obtained by previously adjusting the grain size of the raw material powder in this grain size range, and by adding an oxide to prevent grain growth during sintering.

The thermoelectric material of the present invention is a sintered material comprising the crystal grains of the above-mentioned skutterudite and a metal oxide dispersed in the crystal grain boundaries. The metal oxide is included in the raw material grains, and prevents the grain growth and dispersion of the main phase grains during heating for sintering. By previously reducing the powder grain size of the skutterudite compound used as a raw material, the sintered material can have fine crystals.

Fine crystal grains can further decrease the thermal conductivity κ, and the figure of merit can thus be improved. In other words, the area of the crystal grain boundary with respect to the crystal grain size of the sintered material is increased, and the scattering of phonons is accelerated in the crystal grain boundaries. As a result, the thermal conductivity is decreased, and the figure of merit of the sintered material used as a thermoelectric material is improved. In addition, the oxide particles themselves scattered in the crystal grain boundaries act as the centers of phonon scattering, thereby contributing to the decrease in the thermal conductivity.

As the metal oxide, a stable metal oxide can be used, and a rare earth metal oxide is preferably used. The particles themselves of the rare earth metal oxide are also present in the crystal grain boundaries and can increase the Seebeck coefficient. As a rare earth metal, La, Ce or Sm is used, and Ce is particularly desirable.

In the case of an unstable filled-skutterudite thermoelectric material, the above-mentioned dispersion of the metal oxide prevents diffusion among particles in the process of sintering as described later. Therefore, the problem of instability in the filled-skutterudite compound can be overcome, and its thermal stability can be improved.

The thermoelectric material should preferably include 0.1 to 15% (by weight) of metal oxide. If the content is less than 0.1%, the effect of preventing grain growth is small. If the content is more than 15%, the effect is saturated. The content of the oxide should thus preferably be in the range of 1 to 10%.

To produce the above-mentioned thermoelectric material, a compact is previously formed from a mixed powder comprising the powder of skutterudite including Sb or raw materials having the composition corresponding thereto and the powder of a metal oxide, and this compact is sintered to obtain a sintered material. In the case when the raw material powder comprises a $CoSb_3$-based skutterudite compound, for example, the particles of a previously fused $CoSb_3$-based compound can be used. Alternatively, it may be possible to use the mixed powder of metals Co and Sb, mixed in accordance with the composition of $CoSb_3$.

The present invention uses a mixture method wherein insoluble metal compounds, such as hydroxides, are precipitated from an aqueous solution including the corresponding metals by a precipitation method, and the insoluble metal compounds are dispersed to the powder of skutterudite used as a raw material. The particles of the metal oxide obtained by heating and decomposing the insoluble metal compounds are finer than the skutterudite particles, and can be dispersed uniformly to the skutterudite particles. It is therefore possible to dispose fine oxide particles in the grain boundaries of the fine crystal grains in the sintered material formed by sintering.

In the precipitation method, the skutterudite crystal powder to be formed as the main phase is dispersed uniformly in the aqueous solution of the salt or hydroxide of a metal from which an oxide is obtained. This mixture is subjected to pH adjustment, and the oxide of the metal is precipitated as insoluble fine crystals. At the time of precipitation, the crystals are attached to the surfaces of the crystals of the main phase.

For example, by using an aqueous solution of a metal chloride and by adding a small amount of aqueous ammonia, a metal hydroxide can be uniformly attached to the peripheries of the main phase particles. By heating and decomposing the obtained mixture, it is possible to obtain a mixed powder wherein metal oxide particles are dispersed uniformly and thinly on the surface of the main phase. By using the precipitation method, a trace amount of metal oxide can be dispersed uniformly. In addition, a texture wherein the oxide layers enclose the grain boundaries of the main crystals of the structure of the sintered material is obtained by sintering after forming.

The uniform dispersion of the above-mentioned metal oxide is also applicable to a filled-skutterudite thermoelectric material. However, the metal oxide dispersed in the grain boundaries also prevents diffusion among the particles in the process of sintering just as described above. Therefore, the metal oxide prevents decomposition of the filled-skutterudite compound, thereby improving the thermal stability of the compound.

Another embodiment of the present invention includes a $CoSb_3$-based thermoelectric material in particular, wherein a transition metal is included in the crystals of a $CoSb_3$-based skutterudite compound.

In this kind of transition metal, Mn, Cr, Fe or Ru is used as a dopant for holding the $CoSb_3$-based skutterudite compound as a p-type. The substitution amount of the transition metal should preferably be in the range of 0.001 to 0.01 mol in 1 mol of Co of the skutterudite. Although the $CoSb_3$-based skutterudite itself is originally a p-type, by adding Mn, Cr, Fe or Ru to this skutterudite, the Seebeck coefficient S can be increased, whereby the power factor can be improved It is difficult to substitute Co in the $CoSb_3$-based skutterudite with this kind of p-type element by using a conventional melting method. In the present invention, the transition metal is diffused in the skutterudite crystals in the process of sintering the mixed powder of the skutterudite compound and the transition metal, whereby Co can be substituted relatively easily.

As a transition metal, i. e., as an element for holding the $CoSb_3$-based skutterudite compound as an n-type, a Ni-group metal (Ni, Pd or Pt) or a precious metal (Cu, Ag or Au) can be used. Therefore, it is possible to obtain an n-type skutterudite thermoelectric material having the same crystal structure as that of the p-type skutterudite thermoelectric material and also having a thermal expansion coefficient close to that of the p-type skutterudite thermoelectric material. By sintering and joining the two skutterudite thermoelectric materials, it is possible to obtain a thermally stable thermoelectric couple.

For the substitution by using the above-mentioned transition metal in particular, the present invention uses a method of uniformly dispersing the raw material powder of the $CoSb_3$-based compound or the like and the transition metal.

In this kind of method for uniformly dispersing the transition metal, the transition metal is electroless-plated to the powders of Co and Sb or the powder of a $CoSb_3$-based compound in order to obtain a mixed powder. The mixed powder is formed and then sintered.

Furthermore, as another method for uniform dispersion, a method for mechanically ironing the transition metal on the surfaces of the powders of Co and Sb or the powder of the $CoSb_3$-based compound is used to obtain a mixed powder. The mixed powder is formed and then sintered in the same way.

Moreover, as still another method for uniform dispersion, a method for dispersing the powders of Co and Sb or the powder of the $CoSb_3$-based compound and then carrying out hydrogen reduction in an aqueous solution including the transition metal is used to obtain a mixed powder.

This kind of method for uniformly dispersing the transition metal is also used to add a nickel group metal (Ni, Pd or Pt) or a precious metal (Cu, Ag or Au) as an element for converting the $CoSb_3$-based skutterudite into an n-type.

To prepare the raw material powder of a Sb-containing skutterudite compound before sintering, various methods can be used. It is preferable to use a method wherein a raw material including Co and Sb is melted, coagulated and subjected to heating for homogenization so that a desired skutterudite crystal phase, such as a $CoSb_3$-based compound, is uniformly precipitated in a solid and pulverized to a desired grain size.

In this method, when the $CoSb_3$-based compound is taken as an example, Co, Sb and other above-mentioned metals required are mixed so as to have the composition of the above-mentioned compound. The mixture is melted in the crucible of a melting furnace having a nonoxidative atmosphere or an inert atmosphere in particular. After the melting condition is maintained, a crystallization temperature (600 to 860° C.), lower than the precipitation start temperature (about 876° C.) of the $CoSb_3$-based compound, is maintained in the furnace to carry out heating for homogenization. By the heating for homogenization, the $CoSb_3$-based compound is precipitated completely, thereby attaining homogenization without segregation.

An ingot obtained when cooled after the above-mentioned heating for homogenization is pulverized, classified in accordance with a desired grain size distribution, and used for the powder of the $CoSb_3$-based compound.

In this pulverizing and classifying step, the grain size of the skutterudite compound, which determines the crystal grain size of a sintered material, is adjusted in a desired range of 100 $\mu$m or less.

By using the above-mentioned method, the powder of the skutterudite compound is uniformly mixed with the powder of a metal oxide or preferably a transition metal. The mixed powder is usually compressed to form a compact.

The discharge plasma sintering method is preferably used to sinter the thermoelectric materials of the present invention. A discharge plasma sintering apparatus is provided with a cylindrical die formed of carbon and two carbon punches inserted into the hollow portion of the die from both ends of the die, inside a vacuum container. The apparatus is also provided with a powder supply for supplying pulse current across the two punches, and pressure application means for applying pressure to the two punches. A compact formed of a skutterudite powder, a required metal oxide and a required transition metal is previously inserted into the cylindrical die, the two punches are inserted into the die, and the compact is pressed against the end surfaces of the punches. At the time of this pressure application, the pulse current is flown across the two punches under vacuum, whereby the compact is heated, compressed and densified.

Since the skutterudite crystal grains in the compact are conductive, current flows through the compact at the time of sintering. However, inside the compact, plasma discharge occurs among the numerous crystal grains making contact with one another during the early stage of heating, thereby generating heat. The grains are heated, beginning with their surfaces, to high temperature, and densification advances rapidly. The compact is also heated by Joule's heat generated when the current passes inside the crystals. During sintering the fine metal oxide particles in the mixture prevents grain growth, whereby making it possible to maintain the small skutterudite grain size level which it obtained at the time of mixing.

The sintering should be carried out at a press pressure of 100 to 1000 $kgf/cm^2$. The sintering temperature should preferably be in the range of 600 to 800° C., which is lower than the melting point of the skutterudite crystals.

In the discharge plasma sintering method, it is possible to complete 90% or more of the entire sintering process in a short time of not more than 10 minutes, usually 2 to 5 minutes, by properly selecting current depending on the size of the compact.

The thermoelectric material of the present invention preferably includes a filled-skutterudite compound having a composition represented by $Ln_yFe_xCo_{4-x}Sb_{12}$ (Ln, a rare earth metal: $0<y\leq1$, Fe: $0<x\leq4$) as described above. The filled-skutterudite compound is a compound wherein the vacancies in the $CoSb_3$ crystal structure are filled with another rare earth element, and part or whole of Co is substituted with Fe for charge compensation. In particular, La, Ce, Pr, Nd, Sm, Gd or the like is used as the rare earth element Ln.

It is preferable that y of the rare earth metal Ln should be $0.4\leq y\leq1$, and that x of Fe should be $2\leq x\leq4$. If $0.4>y$, the filling rate becomes too low, and the phonon scattering effect is lowered. If $y>1$, an excessive amount of the rare earth element precipitates as a different phase. In this case, x of Fe is set in the range of $2\leq x\leq4$ to securely obtain the carrier level wherein the skutterudite becomes a p-type.

In addition, y of Ln and x of Fe in the composition should further preferably be $3\leq x\leq4$ and $0.8\leq y\leq1$. These composition ranges are desirable, since the thermal conductivity $\kappa$ can be decreased owing to photon scattering, and an appropriate carrier level can be obtained.

Two or more kinds of rare earth metals can be included as Ln. Since the lattices are filled with different kinds of elements, they have differences in mass and distortion, whereby phonon scattering can be increased, and the thermal conductivity $\kappa$ can be decreased further. For example, the combination of La and Ce can be used, and a mole ratio of the contents of La and Ce can be selected in the range of 40:60 to 60:40. This range of the mole ratio is preferable, since the effects of generating the differences in the mass and distortion of the lattices are significant.

The thermoelectric material of the present invention can use Hf instead of Ln, and can include a thermoelectric material mainly composed of a filled-skutterudite compound having a composition of $Hf_yFe_xCo_{4-x}Sb_{12}$ ($0<x\leq4, 0<y\leq1$).

This kind of skutterudite thermoelectric material including Hf should preferably be a sintered material comprising a Hf skutterudite compound and a metal oxide. Oxides of the above-mentioned one or more rare earth metals Ln are used as metal oxides. As the metals for the oxides, the combination of La and Ce can be used.

In the sintered material, the skutterudite crystals are mainly formed of the skutterudite compound mainly having the above-mentioned composition, and may include a small amount of $FeSb_3$ compound, and a compound added with Fe, Co, Sb and other metal elements.

The present invention uses a thermoelectric material wherein the above-mentioned metal oxides are dispersed in the crystal grain boundaries of the compound having the above-mentioned composition. This kind of oxide-dispersed sintered material is obtained by mixing the fine powders of the oxides in the powder of the previously prepared compound having the above-mentioned composition, by forming the mixture into a desired shape to obtain a compact, and by sintering this compact.

It is possible to use the same method as the method for melting the $CoSb_3$-based skutterudite compound in order to prepare the raw material powder of the filled-skutterudite compound to be sintered. However, a method is preferably used, wherein metal materials Fe, Co and Sb, and a filling element, such as Ce, are melted, coagulated, and heated for homogenization to uniformly precipitate a filled-skutterudite compound in a solid, and then pulverized and classified in accordance with a desired grain size.

As this kind of melting and coagulating method, a method is preferably used, wherein the raw material metals Ln, Fe, Co and Sb are weighed in an inert gas so as to obtain the composition of the above-mentioned compound, and vacuum-sealed in a silica tube ampoule. This ampoule is heated in an electric furnace to melt the metals. The metals are then rapidly cooled and coagulated. After the rapid cooling, the ampoule is heated in the electric furnace again, and maintained at a high temperature wherein filled-skutterudite can be precipitated, for example, 600 to 800° C., lower than the melting point of the electric furnace, to carry out heat treatment for homogenization. By the homogenizing process, the filled-skutterudite compound can be precipitated completely and homogenized.

An ingot obtained when cooled after the heat treatment for homogenization is pulverized, and classified in accordance with a desired grain size distribution, and used for a sintering powder including the filled-skutterudite compound.

In the present invention, the filled-skutterudite compound, the composition of which is prepared, is preferably subjected to further homogenization by a mechanical ironing treatment. By the mechanical ironing treatment, the $FeSb_2$ phase remaining in the alloy can be decreased, and a uniform single phase of the filled-skutterudite can be obtained. In the sintered material, its $FeSb_2$ phase used as a metal phase is decreased to improve the Seebeck coefficient S and to decrease the thermal conductivity κ.

In the $Ln_yFe_xCo_{4-x}Sb_{12}$-based filled-skutterudite thermoelectric material of the present invention, it is particularly important to decrease the level of impurities including $FeSb_2$ and Sb as low as possible in order to maintain the thermoelectric characteristics. In the filled-skutterudite thermoelectric material of the present invention having the composition of $Ln_yFe_xCo_{4-x}Sb_{12}$, the content of the $FeSb_2$ phase in the filled-skutterudite crystal phase is 1% or less in terms of the intensity ratio of the peak diffraction intensity of the $FeSb_2$ phase with respect to the peak diffraction intensity of the filled-skutterudite crystal phase by X-ray diffractometry. When the $FeSb_2$ phase in the thermoelectric material exceeds 1% in terms of the diffraction intensity ratio, this means that the above-mentioned filled-skutterudite is decomposed, and the thermal conductivity of the thermoelectric material increases. Therefore, the diffraction intensity ratio of the $FeSb_2$ phase is limited to 0.1% or less in particular.

In this kind of filled-skutterudite thermoelectric material, all processes from the preparation of raw material powder to a process before sintering are carried out in a nonoxidative atmosphere to prevent entry of oxygen. As the nonoxidative atmosphere, an inert gas atmosphere is used, and vacuum is particularly preferable.

The control in the nonoxidative atmosphere can be attained by vacuum-sealing the metals in the silica tube ampoule, by heating and melting the metals in the electric furnace, and by heating the metals in the rapidly cooled ampoule in the electric furnace again to perform heat treatment for homogenization, as described above.

Furthermore, the process, wherein the ingot obtained when cooled after the heat treatment for homogenization is pulverized and classified and the sintering powder including the filled-skutterudite compound is stored, is carried out in a controlled Ar atmosphere. Furthermore, the process, wherein the filled-skutterudite compound having the prepared composition is subjected to the mechanical ironing treatment, is also carried out in the controlled Ar atmosphere. After preliminary forming, sintering is preferably performed in the above-mentioned vacuum atmosphere by the discharge plasma sintering method to obtain a sintered material.

Since the sintered material is formed of the powder prepared in this kind of controlled atmosphere, no oxygen is attached to the surface of the powder before sintering. This prevents decomposition of the filled-skutterudite due to the falling of the rare earth metals used as filling elements because of the oxidation of the metals during sintering. For this reason, it is possible to limit the generation of a second phase, i.e., an impurity phase, such as $FeSb_2$, even after sintering.

The filled-skutterudite thermoelectric material of the present invention uses a transition element Ni, Pd or Pt as a dopant, and includes the sintered material obtained by heat treatment. Co may be completely substituted with Ni, Pd or Pt.

In particular, the filled-skutterudite thermoelectric material of the present invention includes filled-skutterudite having a composition ratio of $Ln_yFe_xM_{4-x}Sb_{12}$ (Ln: a rare earth metal, $0 \leq x \leq 4$, $0 \leq y \leq 1$), wherein M is Ni, Pd or Pt.

The filled-skutterudite including Co forms a stable $CoSb_3$ phase and makes filling impossible. However, since Ni, Pd or Pt, with which Co is substituted, does not form any stable compound with Sb, it functions as a complete dopant. For this reason, no second phase is generated, and the carrier level can be controlled. This kind of filled-skutterudite, including Ni, Pd or Pt in particular, can be used as an n-type filled-skutterudite thermoelectric material.

This kind of filled-skutterudite thermoelectric material having the composition ratio of $Ln_yFe_xM_{4-x}Sb_{12}$ (Ln: a rare earth metal, $0 \leq x \leq 4$, $0 \leq y \leq 1$), wherein Co is substituted with Ni, Pd or Pt, is subjected to pretreatment processes before sintering in a vacuum atmosphere or in an inert gas atmosphere.

Furthermore, the thermoelectric couple of the present invention is a sintered material having a p-n junction, wherein p-type and n-type skutterudite thermoelectric materials including Sb are integrally joined to each other by sintering.

In this kind of thermoelectric couple, its high-temperature end does not make contact with any metal such as an electrode material having a different thermal expansion coefficient. Therefore, wire breakage and improper contact can be reduced, and reliability and durability can be improved.

As the p-type Sb-containing skutterudite thermoelectric material, the above-mentioned $Ln_yFe_xCo_{4-x}Sb_{12}$-based filled-skutterudite is used, and the above-mentioned $Ln_yFe_xM_{4-x}Sb_{12}$-based filled-skutterudite wherein Co is substituted with Ni, Pd or Pt is used as the n-type. As a result, it is possible to form a thermoelectric couple having high thermoelectric characteristics.

The thermoelectric couple is formed as described below. The p-type and n-type skutterudite material powders are each formed into a compact. The p-type and n-type compacts thus obtained are combined so as to make contact with each other, and sintered so as to be integrated. The integrated sintered material is cut or processed so as to include a p-n junction surface, thereby forming a p-n junction material. Next, the junction material is dissected so that part of the p-n junction surface remains on the leading end side of the material, and so that the rest of the p-n junction surface is removed. The thermoelectric couple formed in this way has the p-n junction surface only on the leading end side, and this side is used as the high-temperature side. On the trailing end sides, a notch portion is provided to separate the p-type and n-type thermoelectric materials from each other. The trailing end sides are the low-temperature sides, and each of them is connected to a metal conductor used as a lead, by an ordinary method, such as brazing. Usually, a plurality of thermoelectric couples are connected in series via the leads and used as a thermoelectric module to generate electric power.

The thermoelectric module formed of the filled thermoelectric materials of the present invention is used for an apparatus having a heat source. Electric power generated by applying a temperature difference from the heat source to the thermoelectric module is used to drive the interior of the apparatus, whereby the apparatus is used as a power-cordless apparatus. This kind of filled-skutterudite thermoelectric module can thus be used with a high-temperature heat source exceeding 400° C., such as a catalytic combustion apparatus and a kerosene burner.

EXAMPLES (Example 1)

The thermoelectric material of the present example used a $CoSb_3$-based compound as skutterudite. In order to finely disperse a metal oxide on the peripheries of skutterudite particles, a method of performing precipitation from a solution was used when preparing a mixed powder before sintering.

By using the precipitation method, the compound particles and a trace amount of metal oxide can be dispersed uniformly. This mixed powder is formed and sintered to obtain a densified sintered material.

In the method of performing precipitation from a solution, a powder used to form the main phase is dispersed uniformly in an aqueous solution of the chloride of a metal to be oxidized, and a small amount of aqueous ammonia is added thereto. As a result, a metal hydroxide is uniformly attached to the peripheries of the powder particles. After dehydration, the particles are heated and decomposed to obtain a mixed powder in which a metal oxide is dispersed uniformly and thinly on the main phase particles. The mixed powder is formed into a desired shape, and then sintered.

More specifically, metal materials were weighed so that metal Co (purity: 99.9985%), metal Sb (99.9999%) and metal Fe ( 99.9%) had a composition ratio of $Co_{0.997}Fe_{0.003}Sb_3$ after sintering, and then heated at a melting temperature of 1100 to 1200° C. in the crucible of an electric furnace in an Ar atmosphere for two hours so as to be melted. Next, the melted material in the crucible was kept heated for 10 hours at 850° C., lower than the crystallization temperature (876° C.) of $CoSb_3$, to carry out homogenization, thereby obtaining skutterudite crystals by solid-phase diffusion. An ingot was obtained and roughly pulverized, and then finely pulverized by a planetary ball mill to have an average grain size of 100 $\mu$m or less. As a result, the powder of $CoSb_3$-based compound was obtained.

This powder was dispersed in an aqueous solution of $LaCl_3$, and a small amount of aqueous ammonia was dropped thereto, whereby insoluble $La(OH)_3$ was precipitated to the powder of $CoSb_3$-based compound to obtain a mixed precipitate. The precipitate was dehydrated, dried and heated to decompose the hydroxide. Consequently, a mixed powder was obtained, wherein $La_2O_3$ particles were dispersed uniformly on the surfaces of the particles of the $CoSb_3$-based compound powder. This mixed powder was preliminary press-formed into a compact, and the compact was sintered by using a discharge plasma sintering apparatus. The sintering was carried out for four minutes at a press pressure of 500 kgf/cm$^2$ and a sintering temperature of 700° C.

Figure 1B:
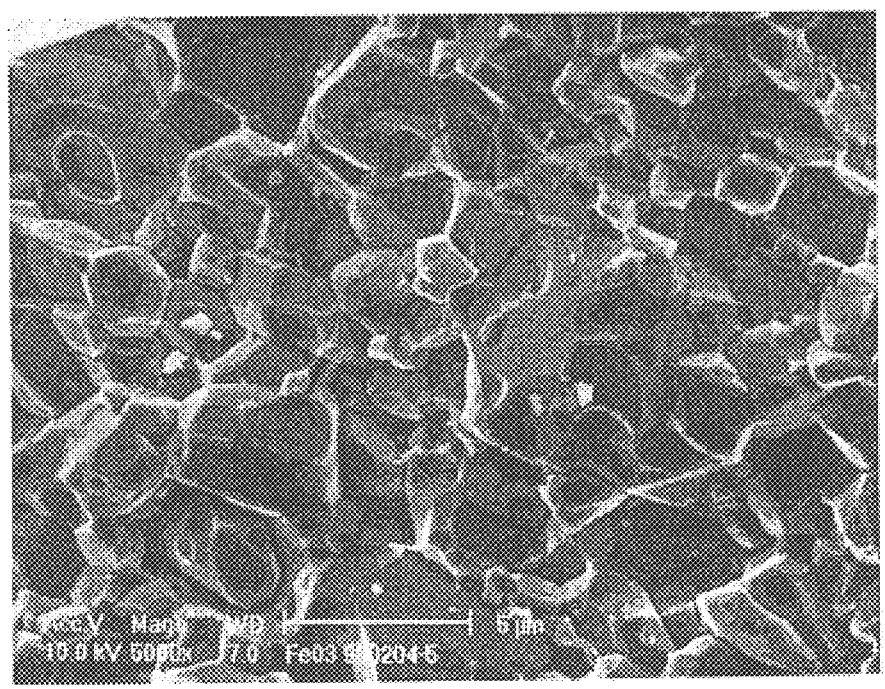
FIG. 1B is another SEM photograph similar to FIG. 1A, showing the distribution of particles at a cutaway surface of only the $Co_{0.997}Fe_{0.003}Sb_3$.
Figure 2:
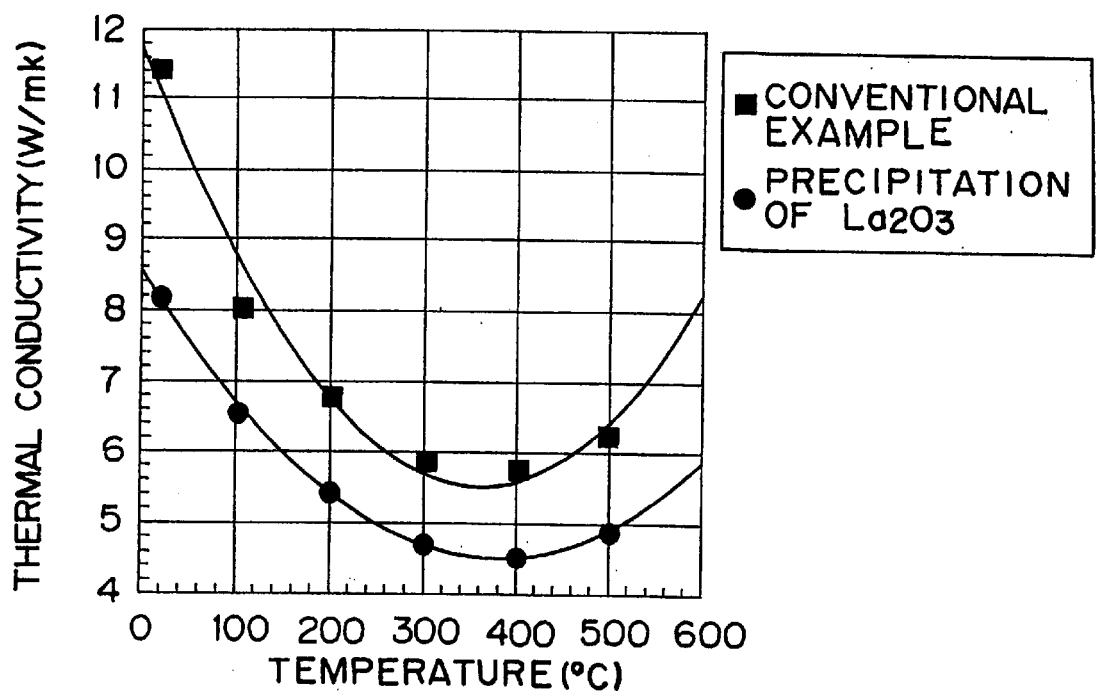
FIG. 2 is a graph showing the relationship between temperature and thermal conductivity of the sintered material formed of a mixture of the $Co_{0.999}Fe_{0.001}Sb_3$ compound and $La_2O_3$ in accordance with the example of the present invention.

FIG. 1A is an SEM photograph of a mixed sintered material composed of the compound obtained as described above and $La_2O_3$. In comparison with this photograph, FIG. 1B offers an SEM photograph of a sintered material composed of only the $Co_{0.997}Fe_{0.003}Sb_3$ compound sintered in the same conditions. Referring to these photographs, it is understood that the mixed sintered material composed of the $Co_{0.997}Fe_{0.003}Sb_3$ compound and $La_2O_3$ is formed of fine particles as a result of the prevention of grain growth. FIG. 2 shows the thermal conductivities κ of these samples. The minimum thermal conductivity κ of the mixed sintered material is 4.5 W/mK. The thermal conductivity can thus be made lower than a conventional value of 6 W/mK.

(Example 2)

In this example of the present invention, a transition metal was uniformly dispersed in the powder of a $CoSb_3$-based compound and sintered to obtain a sintered material.

When Cu was taken as a transition metal for example, a copper chloride was dissolved in an aqueous solution, and a $CoSb_3$ compound powder was added thereto. After this condition was maintained at 40 to 60° C., the powder of the $CoSb_3$ compound powder wherein the particles were coated with Cu films was obtained. The Cu-coated particles were compressed and formed into a compact. The compact was sintered by the discharge plasma sintering method in the same conditions as those in Example 1. The sintering of the compact was conducted for four minutes at a press pressure of 500 kgf/cm$^2$ and a sintering temperature of 700° C.

Figure 3:
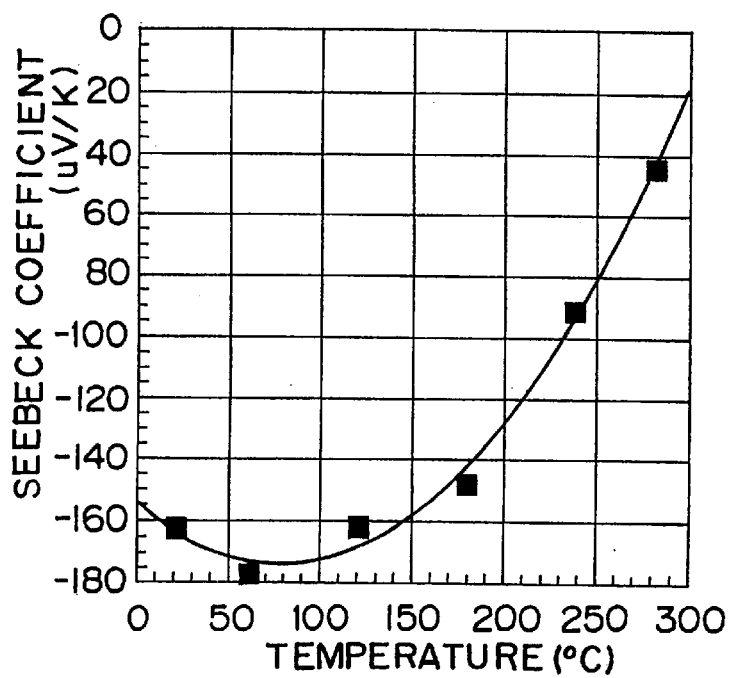
FIG. 3 is a graph showing the relationship between temperature and the Seebeck coefficient of the sintered material formed of a Cu-plated $CoSb_3$ compound in accordance with an example of the present invention.

FIG. 3 shows the relationship between temperature and the Seebeck coefficient of the sintered material formed of the Cu-coated $CoSb_3$ compound obtained as described above. Since the Seebeck coefficient is negative, it is understood that the material has been changed to an n-type by the substitution with Cu. In a conventional case when Cu was added in the form of powder, no change to the n-type was observed. Therefore, it is understood that the substitution of Co with Cu has been accelerated by the uniform dispersion.

(Example 3)

An experiment of adding a transition metal Fe to a $CoSb_3$-based thermoelectric material was conducted as described below. Co and Sb powders were prepared and dispersed in an aqueous solution of an iron nitrate so that the composition of $Co_{0.997}Fe_{0.003}Sb_3$, wherein 0.3 mol % of Co was substituted, was obtained after sintering. Next, the aqueous solution was evaporated to dryness to obtain a powder.

The powder was heated to 700 to 800° C. and retained in an Ar flow including diffractometry hydrogen to subject an iron oxide to hydrogen reduction. As a result, a mixed powder was obtained, wherein fine powders of Co, Sb and Fe were dispersed uniformly.

This mixed powder was preliminary formed and heated for 10 to 30 hours in an Ar atmosphere at a temperature lower than the melting temperature (876° C.) of the $CoSb_3$-based compound. Furthermore, the powder thus obtained was pulverized, and sintered in the same way as Example 1 by the discharge plasma sintering method to obtain the sintered material of the compound.

Figure 4:
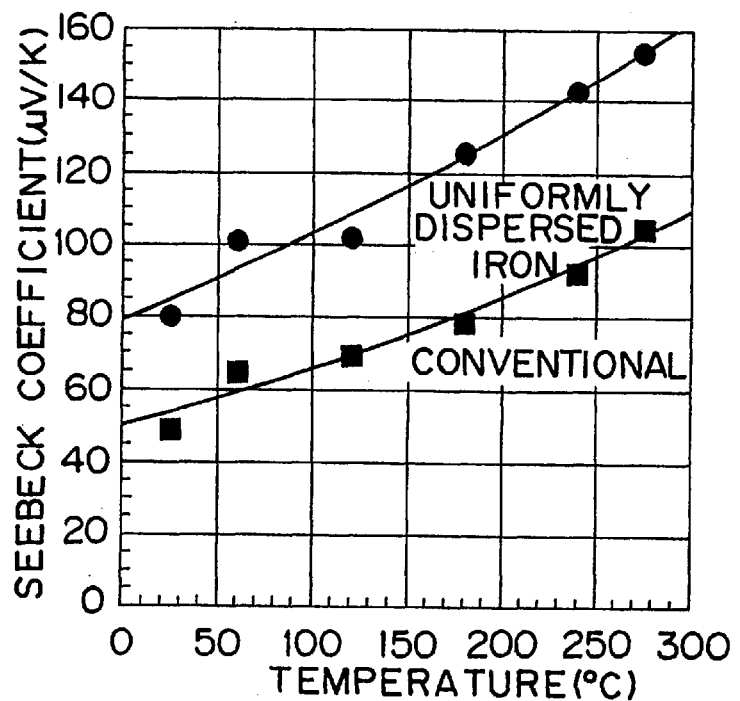
FIG. 4 is a graph showing the relationship between temperature and the Seebeck coefficient of the sintered material formed of a Fe-added $CoSb_3$ compound in accordance with an example of the present invention, and also showing the relationship in the case of the sintered material formed of the $Co_{0.997}Fe_{0.003}Sb_3$ compound.
Figure 5:
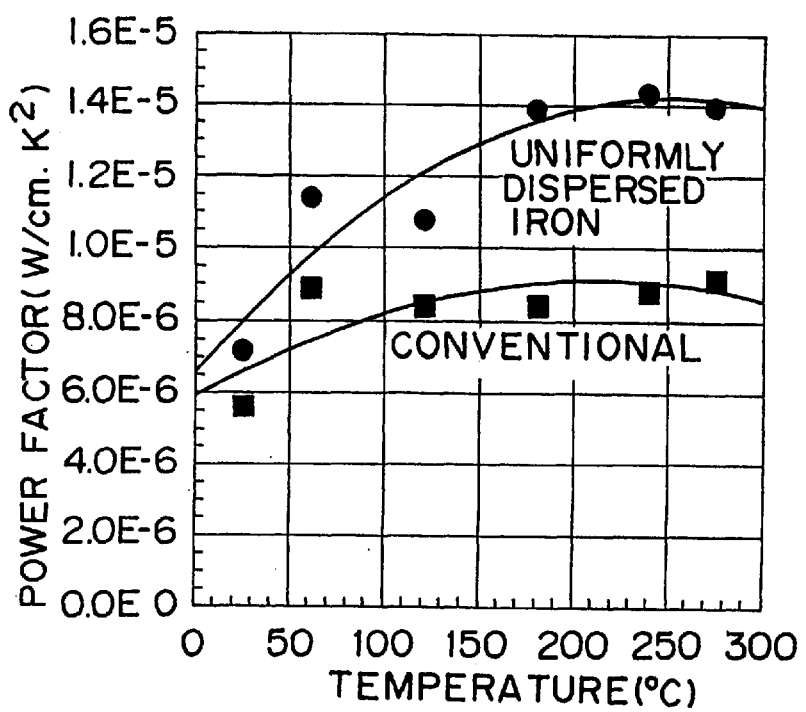
FIG. 5 is a graph showing the relationship between temperature and the power factor of the sintered material formed of the Fe-added $CoSb_3$ compound in accordance with the example of the present invention, and also showing the relationship in the case of the sintered material formed of the $Co_{0.997}Fe_{0.003}Sb_3$ compound.

FIGS. 4 and 5 show the Seebeck coefficient S and the powder factor of the sintered material of the $Co_{0.997}Fe_{0.003}Sb_3$ compound produced as described above. As a result of preventing precipitation of different phases, the Seebeck coefficient S is increased, and the powder factor is also increased. Furthermore, this method can also be carried out in a similar way by using the powder of the $CoSb_3$-based compound as a raw material. By subjecting the obtaining mixed powder to discharge plasma sintering, the sintered material of the $Co_{0.997}Fe_{0.003}Sb_3$ compound can be obtained.

(Example 4)

This example deals with a sintered material wherein the oxide of a rare earth metal is uniformly dispersed in the crystals of a filled-skutterudite compound.

Cerium Ce (purity: 99.9%), iron Fe (purity: 99.9%), cobalt Co (purity: 99.9985%) and antimony Sb (purity: 99.9999%) were used as metal materials. These metal materials were weighed and mixed in an Ar atmosphere so that a composition ratio of $CeFe_3CoSb_{12}$ was obtained after sintering and then vacuum-sealed in a silica tube ampoule. The ampoule was heated in an electric furnace at 1000 to 1100° C. for 20 hours to melt the metal materials.

Next, the ampoule containing the melted metals was immersed in ice water to rapidly cool and coagulate the metals, thereby obtaining an alloy ingot. The ingot was kept heated at 700° C. for 30 hours in the electric furnace again so as to obtain a filled-skutterudite structure by solid-phase diffusion. The obtained ingot was roughly pulverized, and then finely pulverized by a planetary ball mill to have an average grain size of 100 $\mu$m or less. It was confirmed by the X-ray diffractometry that the obtained powder was the powder of filled-skutterudite crystals.

This powder was dispersed in an aqueous solution of $LaCl_3$, and a small amount of aqueous ammonia was dropped thereto, whereby a mixed precipitate composed of the powder of the $CeCoFe_3Sb_{12}$ compound and $La(OH)_3$ was generated. This powder was dried and heated to decompose the hydroxide, whereby a mixed powder was obtained, wherein $La_2O_3$ was uniformly dispersed on the surfaces of the particles of the powder of the $CeCoFe_3Sb_{12}$ compound. This mixed powder was preliminary formed to obtain a compact, and the compact was sintered by using a discharge plasma sintering apparatus. The sintering was carried out for four minutes at a press pressure of 300 kgf/$cm^2$ and a sintering temperature of 600° C. The temperature rising speed was 150° C./minute or less.

Figure 6:
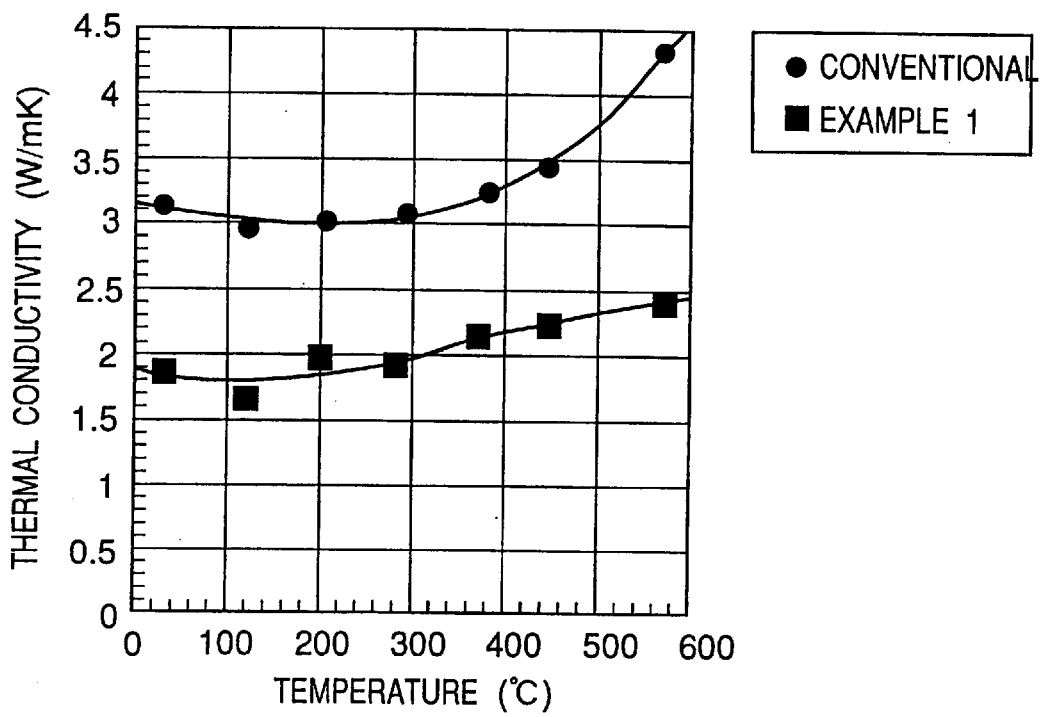
FIG. 6 is a graph showing the relationship between temperature and the thermal conductivity κ of the mixed sintered material composed of a $CeCoFe_3Sb_{12}$ compound and $La_2O_3$ in accordance with an example of the present invention.

FIG. 6 shows the relationship between temperature and the thermal conductivity $\kappa$ of the mixed sintered material composed of the $CeCoFe_3Sb_{12}$ compound and $La_2O_3$ obtained as described above. Furthermore, FIG. 6 also shows the thermal conductivity $\kappa$ of only the $CeCoFe_3Sb_{12}$ compound sintered in the same conditions, without mixed with any oxide.

This figure indicates that the thermal conductivity $\kappa$ of the mixed sintered material is decreased because of the prevention of grain growth and the increase in the scattering of phonons in the grain boundaries, and that the increase in the thermal conductivity on the high-temperature side, caused conventionally, is prevented. This is because La dispersed in the grain boundaries acts as a barrier against diffusion, whereby the $CeCoFe_3Sb_{12}$ compound is prevented from being decomposed.

(Example 5)

In this example, at least two kinds of rare earth metals are used as filling elements for the filled-skutterudite compound. As metal materials, La (purity: 99.9%), and Ce, Fe Co and Sb having the above-mentioned purity values were weighed and mixed in an Ar atmosphere so that a composition ratio of $Ce_{0.5}La_{0.5}Fe_3CoSb_{12}$ was obtained after sintering. The mixture was vacuum-sealed in a silica tube ampoule, and heated at a melting temperature of 1000 to 1100° C. in an electric furnace for 20 hours so as to be melted. Next, the melted metals in the ampoule were immersed in ice water so as to be cooled rapidly, and coagulated. An ingot thus obtained was kept heated at 700° C. for 30 hours in an electric furnace again, thereby obtaining a skutterudite crystal structure by solid-phase diffusion. The obtained ingot was finely pulverized to have an average grain size of 100 $\mu$m or less.

Figure 7:
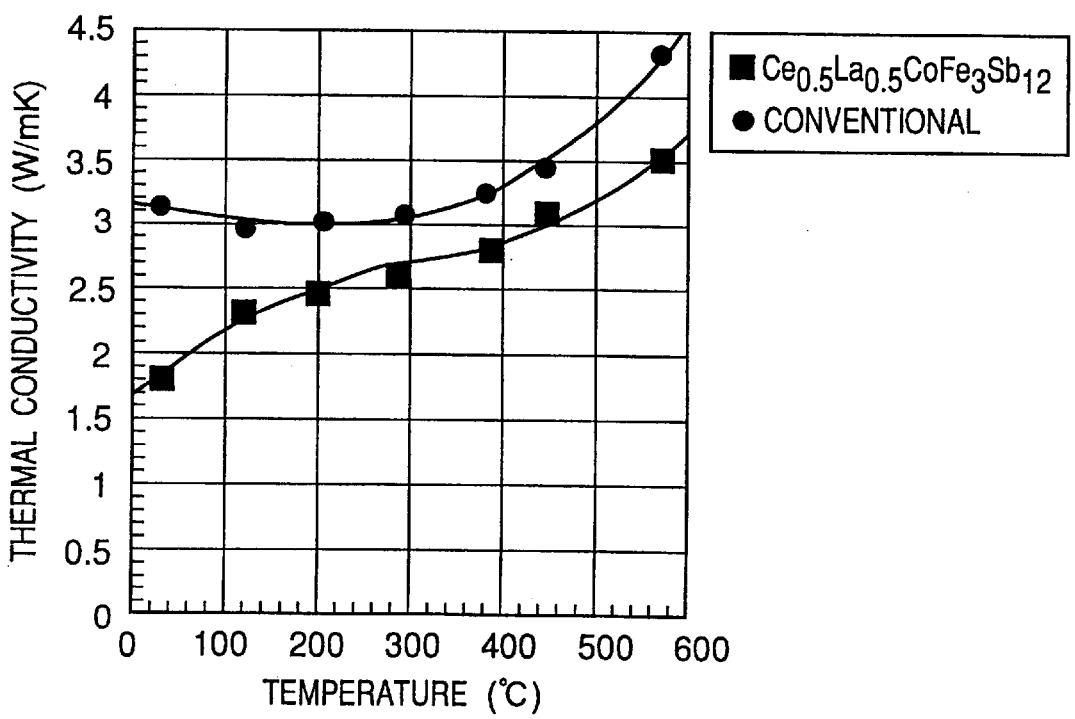
FIG. 7 is a graph showing the relationship between temperature and the thermal conductivity κ of a $Ce_{0.5}La_{0.5}CoFe_3Sb_{12}$ in accordance with an example of the present invention.

This powder was preliminary formed to obtain a compact, and the compact was sintered by using a discharge plasma sintering apparatus. The sintering was carried out for four minutes at a press pressure of 300 kgf/$cm^2$ and a sintering temperature of 600° C. The temperature rising speed was 150° C./minute or less. FIG. 7 shows the relationship between temperature and the thermal conductivity $\kappa$ of the sintered material obtained as described above. The thermal conductivity is decreased because of the increase in the scattering of phonons.

(Example 6)

In this example, Hf is used as a filling element for a filled-skutterudite compound. Conventionally, the rare earth element Ln is present in alloys in a condition wherein its trivalent and tetravalent states are mixed. Therefore, it is difficult to perform accurate charge compensation, and it is also difficult to control the carrier level. In the case of Hf, however, Hf takes only the tetravalent state in alloys. Therefore, charge compensation can be carried out more accurately.

Hafnium Hf (purity: 99.9%), iron Fe (purity: 99.9%) and antimony Sb (purity: 99.9999%) were weighed and mixed in an Ar atmosphere so that a composition ratio of $HfFe_4Sb_{12}$ was obtained after sintering, and then vacuum-sealed in a silica tube ampoule. The ampoule was heated in an electric furnace at 1000 to 1100° C. for 20 hours to melt the metal materials. Next, the ampoule was immersed in ice water to rapidly cool and coagulate the metals. An ingot thus obtained was kept heated at 700° C. for 30 hours in the electric furnace again so as to obtain a skutterudite crystal structure by solid-phase diffusion. The obtained ingot was roughly pulverized by a mortar, and then finely pulverized by a planetary ball mill to have an average grain size of 100 $\mu$m or less.

In this example, without being mixed with an oxide, this crystal powder was preliminary compressed and formed to obtain a compact and the compact was sintered by using a discharge plasma sintering apparatus. The sintering was carried out for four minutes at a press pressure of 300 kgf/$cm^2$ and a sintering temperature of 600° C. The temperature rising speed was 150° C./minute or less.

Figure 8:
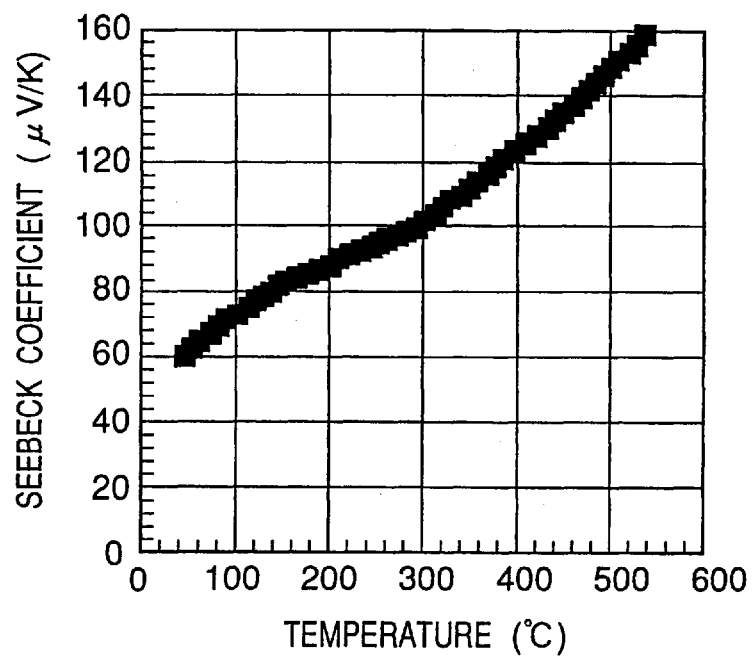
FIG. 8 is a graph showing the relationship between temperature and the Seebeck coefficient of a $HfFe_4Sb_{12}$ compound in accordance with an example of the present invention.
Figure 9:
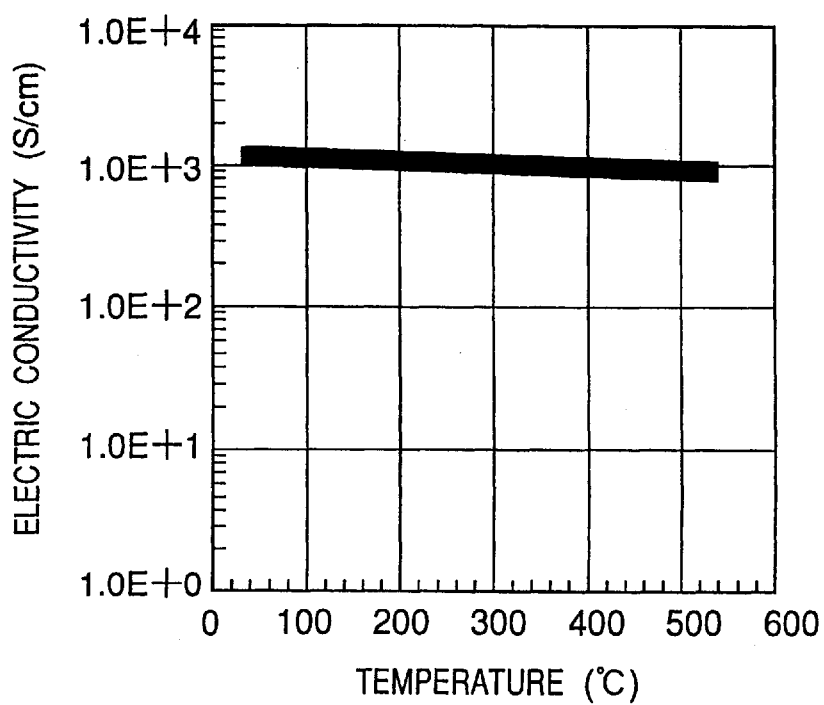
FIG. 9 is a graph showing the relationship between temperature and the electric conductivity of the $HfFe_4Sb_{12}$ compound in accordance with the example of the present invention.

FIG. 8 shows the relationship between temperature and the Seebeck coefficient of the sintered material obtained as described above, and FIG. 9 shows the relationship between temperature and the electric conductivity of the sintered material. Referring to these figures, in comparison with the filled-skutterudite thermoelectric material filled with a rare earth metal, it is understood that the Seebeck coefficient of the sintered material is improved, and that its electric conductivity is decreased. This is because the carriers released from the rare earth metal not used for filling owing to the difference in valence are decreased. By using Hf for filling, more accurate charge compensation can be carried out, and the carrier level can be controlled easily.

(Example 7)

In this example, the mechanical ironing method is used for the process of preparing the alloy in the method of producing a filled-skutterudite thermoelectric material mainly composed of Ce, Fe, Co and Sb. With this method, the reaction of trace amounts of different phases remaining in the alloy is accelerated to obtain the powder of a single-phase, uniform, filled-skutterudite compound.

Metal materials Ce (purity: 99.9%), Fe (purity: 99.9%), Co (purity: 99.9985%) and Sb (purity: 99.9999%) were weighed and mixed in an Ar atmosphere so that a composition ratio of $CeFe_3CoSb_{12}$ was obtained after sintering, and then vacuum-sealed in a silica tube ampoule. The ampoule was heated in an electric furnace at 1000 to 1100° C. for 20 hours to melt the metal materials.

Next, the ampoule was immersed in ice water to rapidly cool and coagulate the melted metals. An ingot thus obtained was kept heated at 700° C. for 30 hours in the electric furnace again so as to obtain a filled-skutterudite crystal structure by solid-phase diffusion.

The obtained ingot was roughly pulverized by a mortar and then subjected to the mechanical ironing by a planetary ball mill for three hours. A pot made of agate and a bowl made of zirconia having a diameter of 5 mm were used for the mechanical ironing. FIGS. 10A and 10B show the results of the X-ray diffractometry of the compound powders obtained before and after the mechanical ironing, respectively. The results of the X-ray diffractometry indicate that the $FeSb_2$ phase after the mechanical ironing is decreased in comparison with the phase before the mechanical ironing, and that the phase has been obtained as a more uniform single phase.

The powder of the oxide of Ln, i.e., $Ln_2O_3$, was uniformly dispersed to the powder obtained after the above-mentioned mechanical ironing by using a method of performing precipitation from an aqueous solution of $LaCl_3$ in the same way as Example 4. The powder was preliminary formed into a compact. The compact was sintered by a discharge plasma sintering apparatus in the same conditions as those in Example 4. By decreasing the $FeSb_2$ phase used as a metal phase, the Seebeck coefficient S of the sintered material can be improved, and the thermal conductivity κ thereof can be decreased.

Metals Ce (purity: 99.9%), Fe (purity: 99.9%) and Sb (purity: 99.9999%) used as raw materials were weighed and mixed in an Ar atmosphere so that a composition ratio of $CeFe_4Sb_{12}$ was obtained after sintering, and then vacuum-sealed in a silica tube ampoule. The ampoule was heated in an electric furnace at 1000 to 1100° C. for 20 hours to melt the metals. Next, the ampoule was immersed in ice water to rapidly cool and coagulate the metals. An ingot obtained as described above was kept heated at 700° C. for 30 hours in the electric furnace again so as to obtain a filled-skutterudite crystal structure by solid-phase diffusion. The obtained ingot was roughly pulverized by a mortar in an Ar atmosphere, and then finely pulverized by a planetary ball mill to have an average grain size of 100 μm or less.

This powder was sealed in a carbon die in an Ar atmosphere, and preliminary formed by pressure application. By carrying out all pretreatments for sintering in the Ar atmosphere as described above, oxygen can be prevented from attaching to the surface of the powder, and the falling of the filling element because of oxidation at high temperatures can also be prevented. The preliminary-formed compact obtained as described above was sintered by using a discharge plasma sintering apparatus. The sintering was carried out for four minutes at a press pressure of 300 kgf/cm$^2$ and a sintering temperature of 700° C. The temperature rising speed was 100° C./minute or less.

Figure 11A:
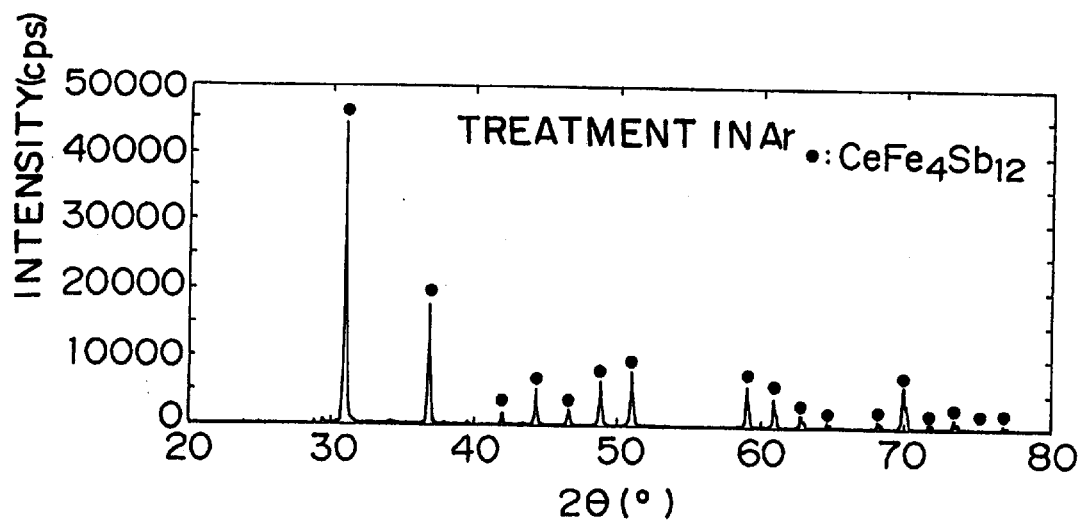
FIG. 11A shows an X-ray diffraction chart for a sintered material in accordance with an example of the present invention obtained after a $CeFe_4Sb_{12}$ compound was treated in an Ar atmosphere.
Figure 11B:
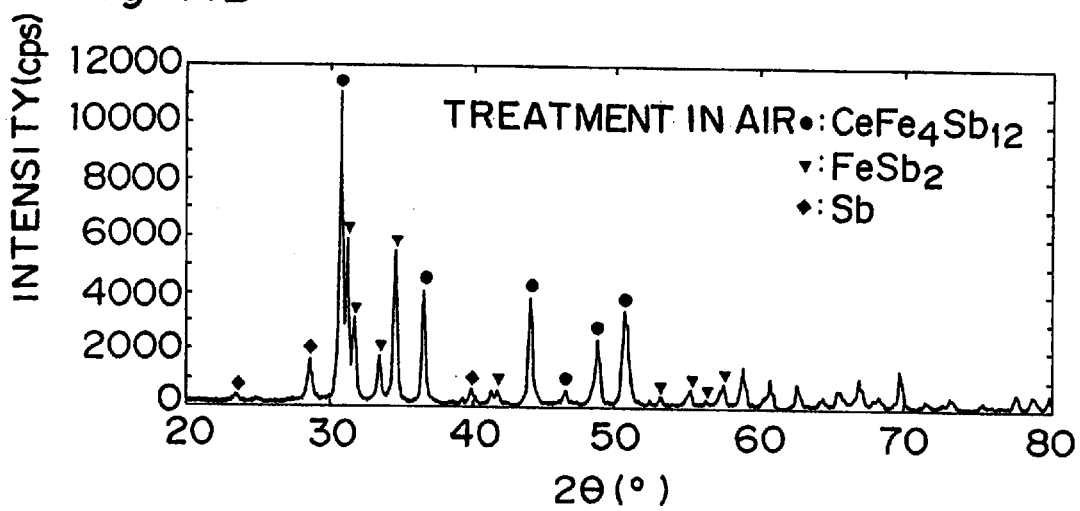
FIG. 11B is an X-ray diffraction chart for a sintered material obtained after the $CeFe_4Sb_{12}$ compound was treated in an air atmosphere, for comparison.

FIG. 11A shows the results of the X-ray diffractometry of the sintered material obtained after a $CeFe_4Sb_{12}$ compound was treated as described above. For comparison, FIG. 11B shows the results of the X-ray diffractometry of the sintered material that was sealed in a die in an air atmosphere and preliminary formed. Referring to the X-ray diffraction chart in the case of the treatment in the air atmosphere, the peak diffraction intensity of $CeFe_4Sb_{12}$ appears around a diffraction angle 2Θ of 31°. Furthermore, the peak of the $FeSb_2$ phase appears close to the peak diffraction intensity curve of $CeFe_4Sb_{12}$. It is thus found that the diffraction intensity ratio of $FeSb_2$ with respect to that of $CeFe_4Sb_{12}$ reaches about 0.5. However, referring to FIG. 11A, in the case of the sample that was sealed in a die in the Ar atmosphere, it is found that the $FeSb_2$ phase is decreased, and the single phase of $CeFe_4Sb_{12}$ is obtained. In this example, the diffraction intensity ratio of $FeSb_2$ was 0.01 or less.

Furthermore, as a result of analyzing this sample by using EPMA, it is found that the content of the impurity phase is 5 wt % or less, and that the content of oxygen is 1 wt % or less.

Figure 12:
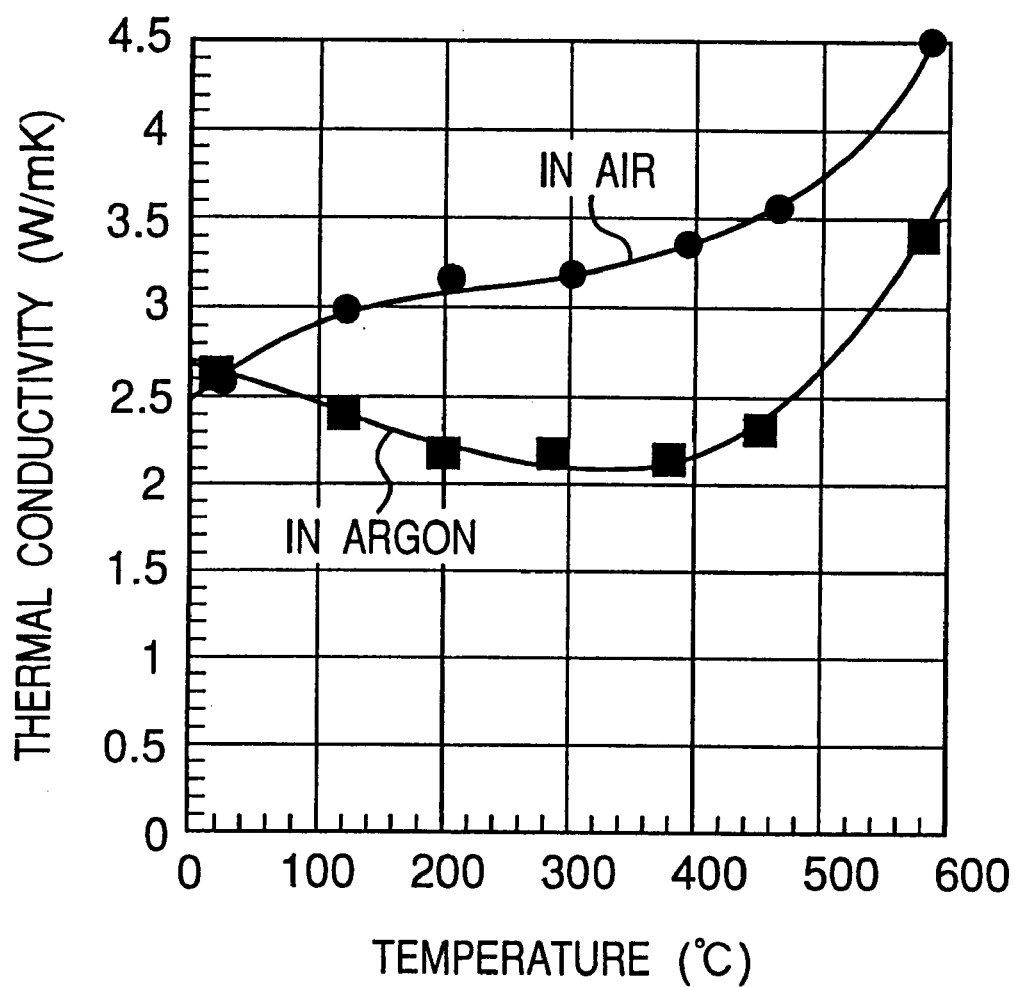
FIG. 12 is a graph showing the relationship between temperature and the thermal conductivity κ of the $CeFe_4Sb_{12}$ compound in accordance with the example of the present invention.
Figure 13A:
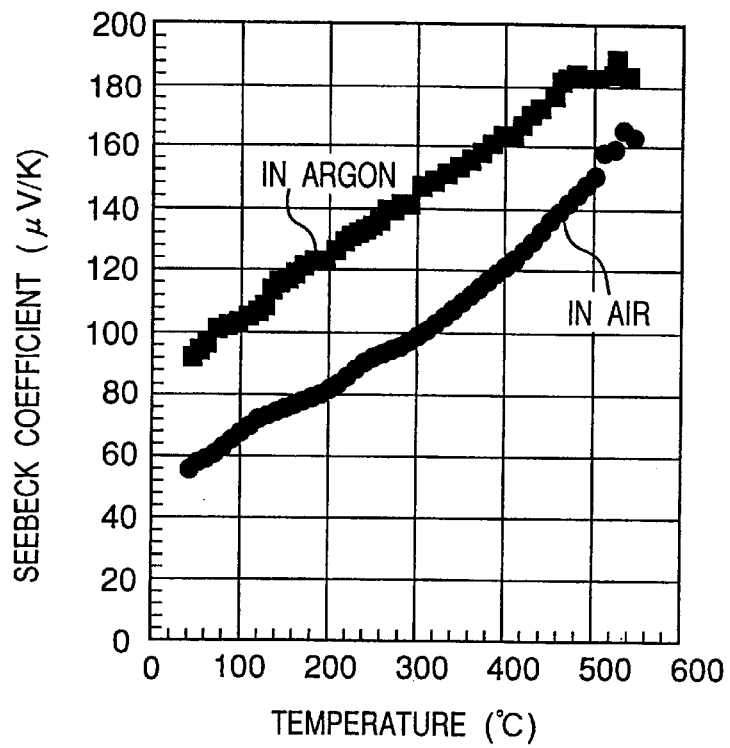
FIG. 13A shows the relationships between temperature and the Seebeck coefficients of the $CeFe_4Sb_{12}$ compounds treated in an Ar atmosphere and in an air atmosphere.
Figure 13B:
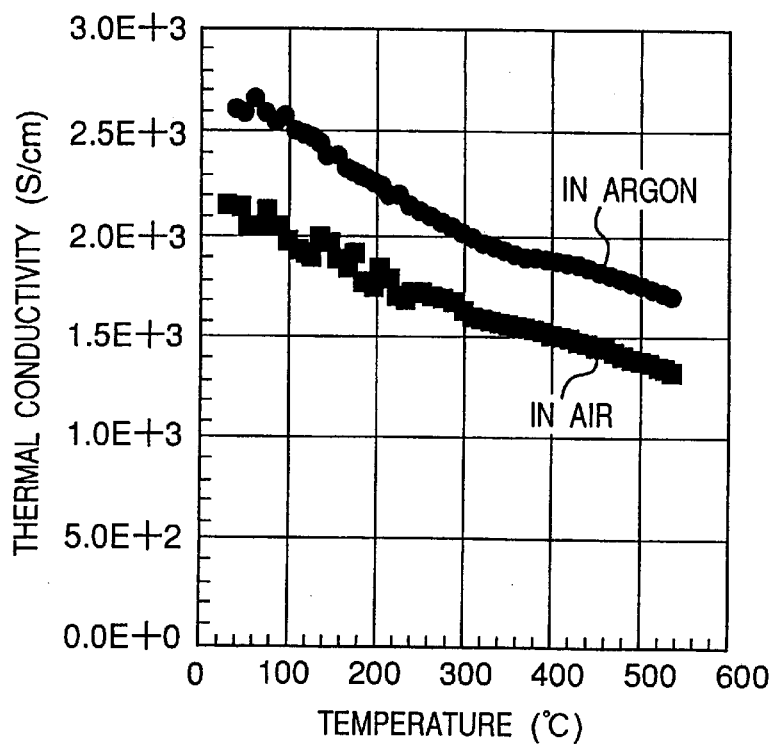
FIG. 13B shows the relationships between temperature and the electric conductivities of the $CeFe_4Sb_{12}$ compounds treated in an Ar atmosphere and in an air atmosphere.
Figure 14:
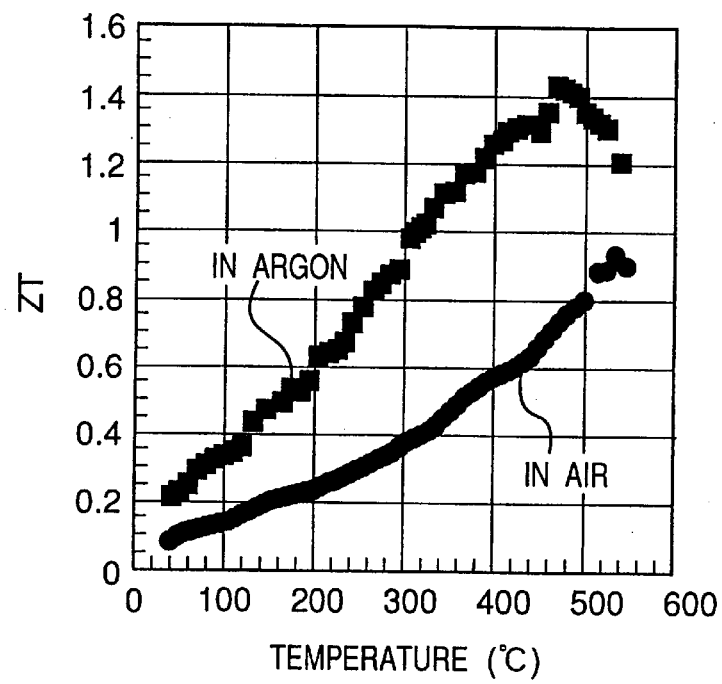
FIG. 14 is a graph showing the relationships between temperature and the nondimensional figures of merit (ZT) of the $CeFe_4Sb_{12}$ compounds treated in an Ar atmosphere and in an air atmosphere.

Next, FIG. 12 shows the relationships between temperature and the thermal conductivities κ of these samples. Referring to the figure, the thermal conductivity κ of the sintered material preliminary formed in the Ar atmosphere is decreased. This is because $FeSb_2$ used as a metal phase is decreased, and the scattering of phonons is increased. Furthermore, FIG. 13A shows the relationships between temperature and the Seebeck coefficients of these samples, and FIG. 13B shows the relationships between temperature and the electric conductivities of these samples. Additionally, FIG. 14 shows the relationships between temperature and the nondimensional figures of merit (ZT) derived from the calculations of these. It is found that by the decrease in impurities, the Seebeck coefficient can be increased while the electric conductivity is prevented from decreasing, and that ZT reaches 1.4 at 450° C.

(Example 9)

In this example, an n-type filled-skutterudite thermoelectric material having a composition of $CeFe_{2.5}Pt_{1.5}Sb_{12}$ was prepared by using Pt as a dopant.

Metal materials Ce (purity: 99.9%), Fe (purity: 99.9%), Pt (purity: 99.9%) and Sb (purity: 99.9999%) were weighed and mixed in an Ar atmosphere so that a composition ratio of $CeFe_{2.5}Pt_{1.5}Sb_{12}$ was obtained after sintering. The mixture was treated in the same conditions as those in Example 8 to obtain a sintered material.

Figure 15:
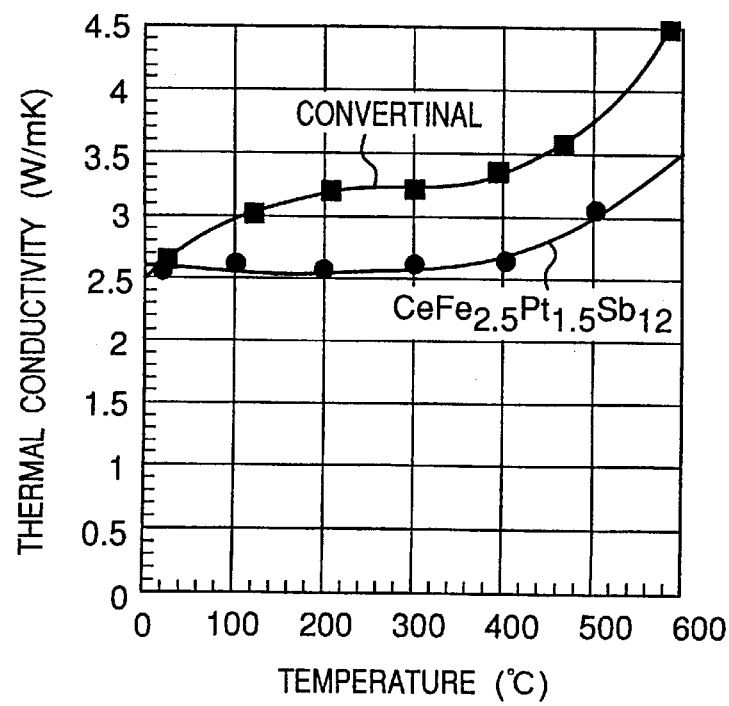
FIG. 15 is a graph showing the relationship between temperature and the thermal conductivity κ of the sintered material formed of a $CeFe_{2.5}Pt_{1.5}Sb_{12}$ compound in accordance with an example of the present invention.
Figure 16A:
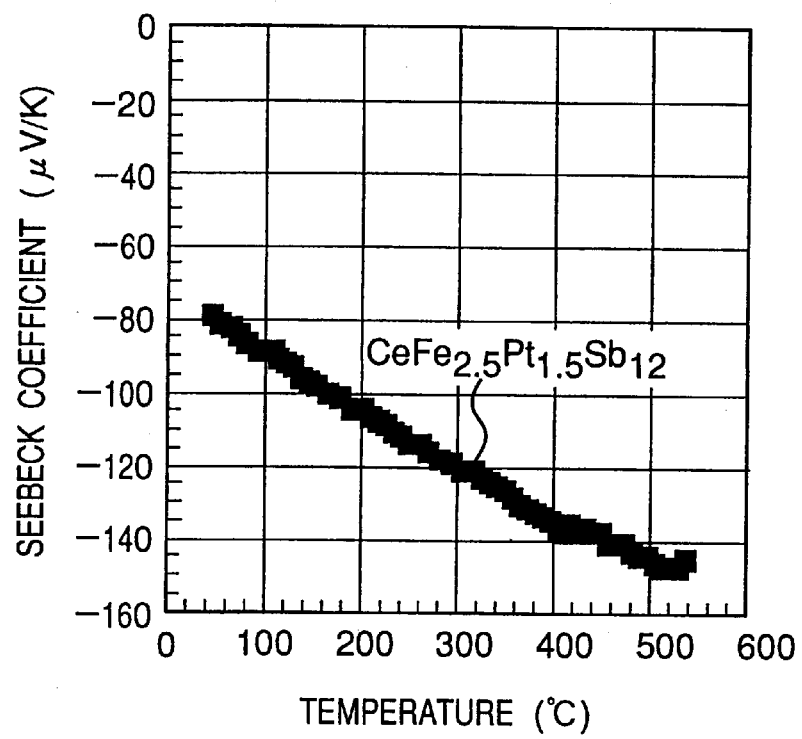
FIG. 16A shows the relationship between temperature and the Seebeck coefficient of the sintered material formed of the $CeFe_{2.5}Pt_{1.5}Sb_{12}$ compound in accordance with the example of the present invention.
Figure 16B:
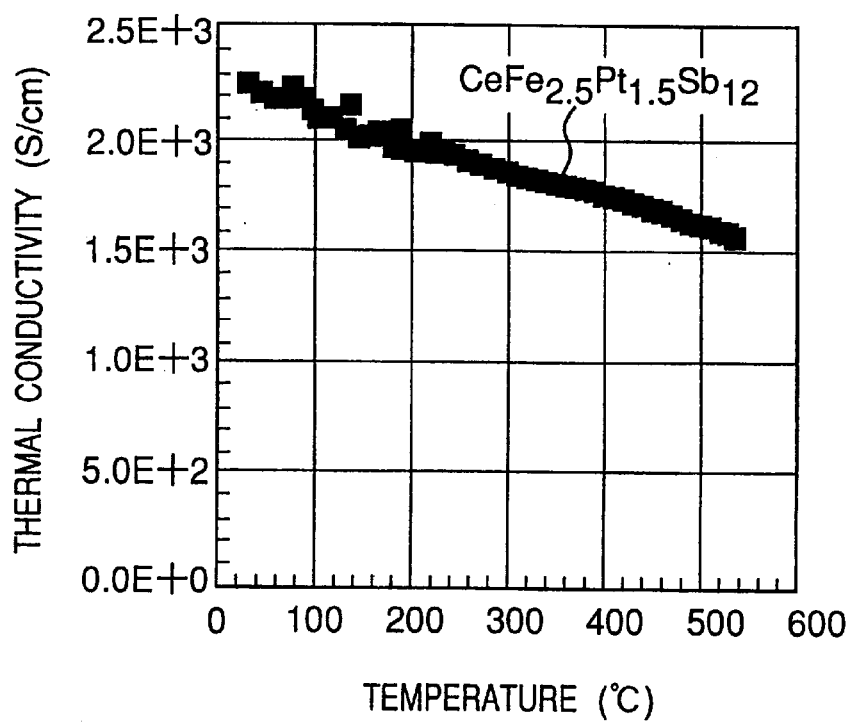
FIG. 16B shows the relationship between temperature and the electric conductivity thereof.

FIG. 15 shows the relationship between temperature and the thermal conductivity κ of the sintered material obtained as described above. Additionally, FIG. 16A shows the relationship between temperature and the Seebeck coefficient of the sintered material, and FIG. 16B shows the relationship between temperature and the electric conductivity thereof. Attention should be given to the fact that the Seebeck coefficient of the $CeFe_{2.5}Pt_{1.5}Sb_{12}$-based material has a large negative value.

By increasing n-type carriers while preventing the filling element from falling as described above, an n-type filled-skutterudite thermoelectric material was able to be obtained while its thermal conductivity was kept low.

(Example 10)

In this example, a thermoelectric couple 6 was integrally formed by sintering from p-type and n-type filled-skutterudite thermoelectric materials.

First, to obtain a p-type filled-skutterudite thermoelectric material, the powder of the $CeFe_4Sb_{12}$-based compound obtained in Example 8 was sealed in a carbon die in an Ar atmosphere, preliminary compressed and formed into a p-type compact layer.

To obtain the other material, i. e., an n-type filled-skutterudite thermoelectric material, the powder of the $CeFe_{2.5}Pt_{1.5}Sb_{12}$-based compound obtained in Example 9 was used. This n-type compound powder was sealed on the above-mentioned p-type compact layer ($CeFe_4Sb_{12}$-based compound) having already been formed and remaining in the die in an Ar atmosphere, and compressed again so as to be formed. As a result, a preliminary formed compact having two layers (p and n layers) was obtained.

Figure 17A:
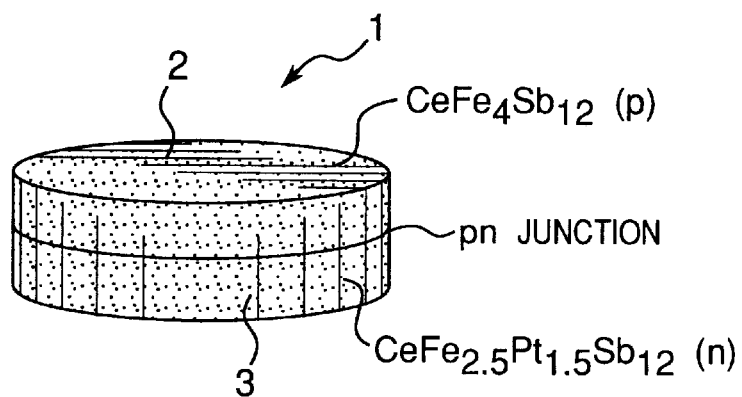
FIGS. 17A to 17D are perspective views showing steps of producing a thermoelectric couple having a p-n junction in accordance with an embodiment of the present invention.
Figure 17B:
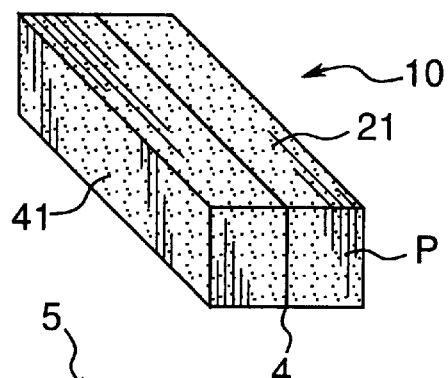
Figure 17C:
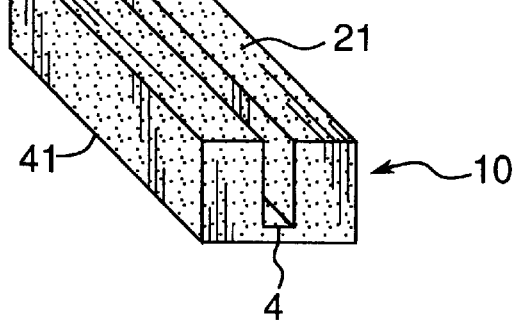
Figure 17D:
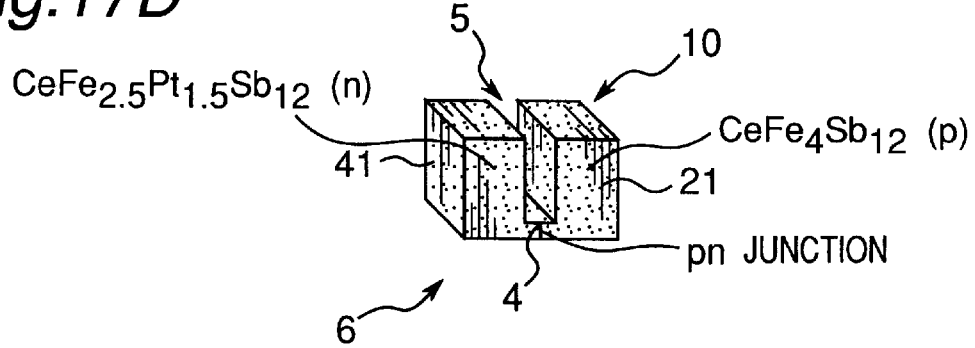

The obtained two-layer compact was sintered by using a discharge plasma sintering apparatus. Sintering was carried out for four minutes at an application pressure of 300 $kgf/cm^2$ and a sintering temperature of 700° C. Furthermore, the temperature rising speed was 100° C./minute or less. By this sintering, a thermoelectric sintered material 1 comprising a disc-like p-type sintering layer 2 and a disc-like n-type sintering layer 3, joined to each other, was obtained as shown in FIG. 17A. This disc-like sintered material 1 was cut in the vertical direction into a plurality of p-n junction sintered pieces 10 having a width of 2 to 5 mm.

While the p-n junction surface 4 located only at the leading end of the p-n junction sintered piece remains left, the other junction surface was removed by cutting. In this way, the p-type and n-type thermoelectric material portions were separated from each other by a notch portion 5, whereby a cut piece 10 having a U-shaped cross-section was obtained.

Next, the sintered piece 10 was further cut in a direction perpendicular to its longitudinal direction so as to be formed into thermoelectric couples 6 each having a square cross-section at its open end, in this example. As a result, a filled-skutterudite thermoelectric couple 6 directly joined via a p-n junction was obtained by sintering.

Furthermore, since the open end of this thermoelectric couple is on the low-temperature side, it is possible to obtain a thermoelectric module by joining a plurality of couples in series in the order of pnpn, for example, by soldering metal electrodes thereto.

Conventionally, a Mo electrode was joined to the high-temperature side of the thermoelectric material to be used at high temperatures, for example, by brazing to establish a p-n junction.

However, at a high temperature exceeding 400° C., there was a danger of causing wire breakage or improper contact owing to a distortion caused by the difference between the thermal expansion coefficient of the thermoelectric material and that of the electrode material. In the case of this example, however, by establishing the direct p-n junction by sintering, the junction can be obtained without using any different metal between the two thermoelectric materials. As a result, it is possible to greatly improve the reliability and durability at the junction.

The filled-skutterudite thermoelectric module can be used to generate electric power, when the thermoelectric module is heated by a heat source provided in an apparatus. Electric drive power is generated inside the apparatus, and used as control-use electric power inside the apparatus. As a result, the apparatus can be made power-cordless.

A catalytic combustion apparatus, a kerosene burner and the like are available as this kind of apparatus. Since these heat sources generate heat having temperatures higher than 400° C., such combustion heat cannot be applied sufficiently to conventional thermoelectric materials. However, by using the filled-skutterudite thermoelectric module, operation can be attained at a temperature of 400° C. or higher, whereby large electric power can be obtained by using fewer modules.

The electric power obtained by using the thermoelectric module is stepped up in voltage by a regulator or the like, for example, and is used as a powder source for the internal electrical devices of the apparatus. In addition, by using a power capacitor having a high capacitance or the like, the electric power stored therein can be used even during the standby period or at the start of the apparatus.

Figure 18:
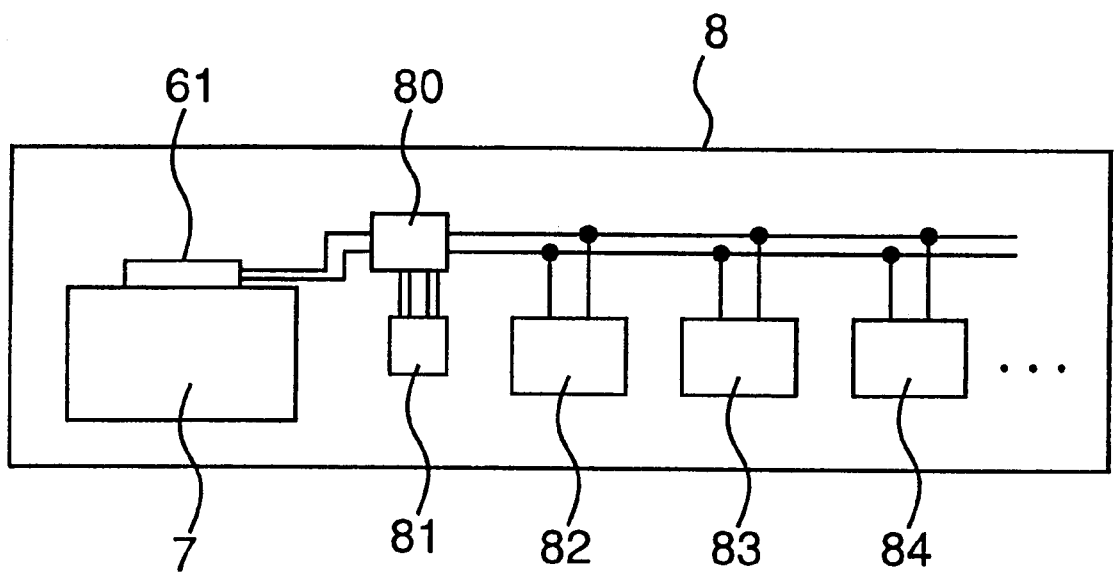
FIG. 18 is a block diagram showing an apparatus provided with a heat source and a thermoelectric module.

FIG. 18 shows an example of a power-cordless apparatus. An apparatus body 8 has a heat source 7 therein. A thermoelectric module 61 is disposed so as to make contact with the heat source 7. While the heat source 7 operates, the electric power generated by the thermoelectric module 61 is controlled by a current control portion 80, and supplied to a cooling fan 82 and a draft fan 83, for example. The electric power is also supplied to a device control portion 84 so as to be used as a power source for control. When the electric power from the thermoelectric module 61 has an extra amount more than necessary, the extra amount of the electric power is stored in a capacitor 81 so as to be used as electric power while the heat source 7 is out of operation.

The thermoelectric material of the present invention is a sintered material wherein a metal oxide is dispersed on the peripheries of the crystal grains of a Sb-containing skutterudite compound. Therefore, the crystal grains are made fine and distributed in the crystal grain boundaries. As a result, it is possible to obtain a thermoelectric material having a low thermal conductivity, whereby a thermoelectric device formed of such thermoelectric materials can have higher thermoelectric conversion efficiency.

By using filled-skutterudite that is filled with a rare earth metal Ln or Hf and substituted with Fe for a Sb-containing skutterudite compound, its crystal grains can be made fine. As a result, it is possible to provide a thermoelectric device having low thermal conductivity, high figure of merit and high thermoelectric conversion efficiency.

The thermoelectric material of the present invention, that is, the $CoSb_3$ compound mainly composed of Co and Sb in particular, includes a transition metal, such as Cr, Mn, Fe, Ru or the like. Including such a transition metal is effective in increasing the Seebeck coefficient and the power factor of the thermoelectric material.

The thermoelectric material of the present invention is filled with a rare earth metal Ln and part of Co of which is substituted with Fe, thereby having a $Ln_yFe_xCo_{4-x}Sb_{12}$-based skutterudite crystal structure. By limiting decomposition so that the content of the impurity phase is 5 wt % or less, the filled-skutterudite thermoelectric material can have excellent stability and high thermoelectric characteristics.

Furthermore, since the filled-skutterudite thermoelectric material has a composition of $Ln_yFe_xM_{4-x}Sb_{12}$ (Ln: a rare earth metal, M: Ni, Pd or Pt), the material can be used as an n-type thermoelectric material having excellent thermoelectric characteristics. This n-type thermoelectric material is combined with, in particular, the filled-skutterudite crystal structure filled with Ln and subjected to substitution with Fe, which is stabilized as described above and used as a p-type thermoelectric material. As a result, a thermoelectric couple can be formed.

The thermoelectric couple of the present invention comprises a p-type thermoelectric material and an n-type thermoelectric material, each being formed of a Sb-containing skutterudite thermoelectric material and having a low thermal expansion coefficient, and directly joined to each other by sintering. The connection at the p-n junction surface is established by sintering. Therefore, even when it is used at high temperatures, the p-n junction surface is not cracked or chipped. The thermoelectric couple is thus stable thermally and high in durability.

In the method of producing the thermoelectric material of the present invention, a mixed powder composed of a Sb-containing skutterudite compound or its ingredients and a metal oxide is sintered. For this reason, crystal grains are prevented from growing in the process of sintering, and the crystal grains of the skutterudite compound are made fine. As a result, it is possible to produce a thermoelectric material having low thermal conductivity and high figure of merit. The thermoelectric device formed of these thermoelectric materials can thus have high thermoelectric conversion efficiency.

By using a method of performing precipitation from an aqueous solution in order to uniformly disperse the powder of a transition metal, fine oxide particles can be distributed uniformly on the surfaces of the compound particles, and the growth of crystal grains can be prevented effectively in the sintering process. This is effective in decreasing the thermal conductivity of the thermoelectric material.

Furthermore, in the method of producing the thermoelectric material of the present invention, the fine powder of a transition metal is dispersed uniformly in the powder of the $CoSb_3$-based skutterudite compound in particular to prepare a mixed powder, and this mixed powder is sintered. This method is, therefore, effective in accelerating the substitution of Co in the skutterudite with the transition metal, in increasing the Seebeck coefficient of the $CoSb_3$-based thermoelectric material, and in raising the powder factor. In particular, by using a p-type dopant, such as Mn, Cr, Fe or Ru, as a transition metal, the characteristics of the p-type $CoSb_3$-based thermoelectric material in particular can be improved significantly.

The transition metal is mixed with the powder of the $CoSb_3$-based compound by electroless plating, by hydrogen reduction after the evaporation of solution to dryness and by mechanical ironing. As a result, a mixed powder wherein the transition metal is dispersed uniformly is prepared. By sintering this mixed powder, the substitution of Co with the transition metal can be accelerated.

By using the discharge plasma sintering method to sinter the mixed powder, a uniform and densified sintered material can be obtained easily in a short time. This method is thus effective in preventing growth of crystal grains by metal oxide dispersion. It is therefore possible to produce a thermoelectric material formed of highly dense, fine crystals and having excellent thermoelectric characteristics.

In addition, regarding the method of producing the thermoelectric materials of the present invention, in the process of producing a thermoelectric material formed of a $Ln_yFe_xCo_{4-x}Sb_{12}$-based filled-skutterudite compound, the material is treated in a nonoxidative atmosphere in the treatment processes before the sintering. Therefore, contamination by oxygen is prevented during the treatment processes. For this reason, Ln or the like in the filled-skutterudite can be prevented from being oxidized, and the filled-skutterudite can be prevented from being decomposed. As a result, the filled-skutterudite can be stabilized, and its thermoelectric characteristics can be improved.

In the processes of producing the sintered material of the filled-skutterudite compound, all the pretreatment processes for the sintering are conducted in a vacuum or inert gas atmosphere. Therefore, the adsorption of oxygen to the compound powder is decreased, and the falling of the filling element owing to oxidation, which may otherwise occur at the time of sintering, can be prevented. As a result, it is possible to obtain a sintered material having a very low impurity level.

In accordance with the present invention, a compact layer formed of the powder of a p-type skutterudite compound and another compact layer formed of the powder of an n-type skutterudite compound are overlaid and sintered to obtain a thermoelectric couple. Therefore, the p-n junction of the couple is formed by sintering, whereby it is possible to obtain a thermoelectric couple having excellent reliability and durability at high temperatures.

Furthermore, in an apparatus having a filled-skutterudite thermoelectric module and a heat source, the interior of the apparatus is driven by using electric power generated owing to the temperature difference applied from the heat source to the thermoelectric module. It is thus possible to obtain a cordless apparatus being high in reliability and low in cost, even when a high-temperature heat source is used.

What is claimed is:

1. A thermoelectric material using a skutterudite thermoelectric material being a sintered material which comprises the crystal grains of a Sb-containing skutterudite compound and a metal oxide dispersed between the grain boundaries thereof, wherein the crystals of said skutterudite compound are formed of a $CoSb_3$-based compound mainly composed of Co and Sb, and the crystals of the $CoSb_3$-based compound include a transition metal other than Co-group metals.

2. A thermoelectric material according to claim 1, wherein the sintered material has an average crystal grain size of 20 $\mu$m or less.

3. A thermoelectric material according to claim 2, wherein said metal oxide is an oxide of a rare earth metal.

4. A thermoelectric material according to claim 1, wherein said transitional metal is Cr, Mn, Fe or Ru, or Ni, Pa, Pt or Cu.

5. A thermoelectric material according to claim 1, being a sintered material obtained by sintering a compact comprising the powder composed of Co and Sb or the powder of said $CoSb_3$-based compound and said transition metal dispersed in said powder.

6. A filled-skutterudite thermoelectric material having a composition ratio of $Ln_yFe_xM_{4-x}Sb_{12}$ wherein Ln is a rare earth metal, $1 \leq x \leq 4$, $0 \leq y \leq 1$, wherein M is Ni, Pd or Pt.

7. A thermoelectric material according to claim 6, wherein said composition satisfies the relationships of $3 \leq x \leq 4$ and $0.8 \leq y \leq 1$.

8. A method of producing a skutterudite thermoelectric material comprising crystals of a Sb-containing skutterudite compound, wherein the thermoelectric material is sintered from a mixed powder comprising said skutterudite compound or the ingredients thereof and a metal oxide, to disperse the metal oxide in the crystal grain boundaries thereof, wherein said Sb-containing skutterudite compound is a filled-skutterudite compound having a composition of $Ln_yFe_xCo_{4-x}Sb_{12}$ wherein $Ln_y$ is a rare earth metal, $0 \leq x \leq 4$, $9 < y \leq 1$), and said mixed powder is obtained by carrying out precipitation from an aqueous solution including metals to disperse a precipitate including said metals to the powder of said skutterudite compound, and by heating and decomposing said precipitate to disperse a metal oxide to the powder of said compound.

9. A method of producing a skutterudite thermoelectric material comprising crystals of a Sb-containing skutterudite compound, wherein the thermoelectric material is sintered from a mixed powder comprising said skutterudite compound or the ingredients thereof and a metal oxide, to disperse the metal oxide in the crystal grain boundaries thereof, wherein said Sb-containing skutterudite compound is a filled-skutterudite compound having a composition of $Ln_y Fe_x Co_{4-x} Sb_{12}$ wherein $Ln_y$ is a rare earth metal, $0<x\leq 4$, $0<y\leq 1$), and the crystals of said skutterudite compound are formed of a $CoSb_3$-based compound mainly composed of Co and Sb, said mixed powder comprises the crystals of said skutterudite compound and a transition metal other than a Co-group metal, and said mixed powder is sintered.

10. A method of producing a thermoelectric material according to claim 9, wherein said mixed powder comprises a transition metal electroless-plated on the powder of said $CoSb_3$-based compound.

11. A method of producing a thermoelectric material according to claim 9, wherein said mixed powder comprises a transition metal mixed on the surface of the mixed powder of Co and Sb or the surface of the powder of said $CoSb_3$-based compound by mechanical ironing.

12. A method of producing a thermoelectric material according to claim 9, wherein said mixed powder is obtained by dispersing the powders of Co and Sb or the powder of said $CoSb_3$-based compound in an aqueous solution in which a transition metal is dissolved, and by evaporating said aqueous solution to dryness and then by carrying out hydrogen reduction.

13. A method of producing a thermoelectric material according to one of claim 12, wherein said transitional metal is Mn, Cr, Fe or Ru, or Ni, Pd, Pt or Cu.

14. A thermoelectric couple comprising a p-type thermoelectric material and an n-type thermoelectric material, each formed of a Sb-containing skutterudite thermoelectric material, integrally joined to each other to form a p-n junction surface, wherein said p-type thermoelectric material is said thermoelectric material according to one of claims 8, 2 or 3, and said n-type thermoelectric material is a Sb-containing skutterudite thermoelectric material, part of Co is substituted with Ni, Pd or Pt.

15. A thermoelectric couple according to claim 14, wherein said n-type $CoSb_3$ thermoelectric material is an n-type filled-skutterudite thermoelectric material having a composition ratio of $Ln_y Fe_x M_{4-x} Sb_{12}$ (Ln: a rare earth metal, $0\leq x\leq 4$, $0\leq y\leq 1$, M: Ni, Pd or Pt), and has a junction established by sintering.

16. A method of producing a thermoelectric couple having a p-n junction by sintering, comprising joining a formed layer of a mixed raw material powder of a p-type filled Sb-containing skutterudite thermoelectric material with a formed layer of a mixed raw material powder of an n-type filled Sb-containing skutterudite thermoelectric material under pressure application, and integrally sintering said layers, wherein said raw material mixed powder is the mixed powder of a skutterudite compound or the ingredients thereof and a metal oxide, comprising the crystals of said Sb-containing skutterudite compound and a metal oxide dispersed in the crystal grain boundaries thereof, and said mixed powder is obtained by carrying out precipitation from an aqueous solution including metals to disperse a precipitate including said metals to the powder of said skutterudite compound, and by heating and decomposing said precipitate to disperse a metal oxide to the powder of said compound.

* * * * *